United States Patent
Klostermann et al.

(10) Patent No.: US 8,084,759 B2
(45) Date of Patent: Dec. 27, 2011

(54) INTEGRATED CIRCUIT INCLUDING DOPED SEMICONDUCTOR LINE HAVING CONDUCTIVE CLADDING

(75) Inventors: Ulrich Klostermann, Perlach München (DE); Ulrike Grüning-von Schwerin, München (DE); Franz Kreupl, München (DE)

(73) Assignee: Qimonda AG, Munich (DE)

( * ) Notice: Subject to any disclaimer, the term of this patent is extended or adjusted under 35 U.S.C. 154(b) by 216 days.

(21) Appl. No.: 11/931,449

(22) Filed: Oct. 31, 2007

(65) Prior Publication Data

US 2009/0108248 A1 Apr. 30, 2009

(51) Int. Cl.
*H01L 29/02* (2006.01)
(52) U.S. Cl. ..... 257/2; 257/750; 257/421; 257/E21.495; 438/652; 438/102
(58) Field of Classification Search ............... 257/2, 750, 257/421, E45.002; 438/652, 102
See application file for complete search history.

(56) References Cited

U.S. PATENT DOCUMENTS

| 5,198,387 A * | 3/1993 | Tang ............................ 438/684 |
| 5,525,829 A * | 6/1996 | Mistry ......................... 257/473 |
| 5,658,807 A | 8/1997 | Manning |
| 5,937,319 A | 8/1999 | Xiang et al. |
| 5,985,702 A | 11/1999 | Manning |
| 6,693,825 B1 | 2/2004 | Sharma et al. |
| 6,911,685 B2 * | 6/2005 | Anthony et al. ............... 257/295 |
| 2002/0113310 A1 | 8/2002 | Kim et al. |
| 2003/0067013 A1 * | 4/2003 | Ichihara et al. ............... 257/200 |
| 2006/0124916 A1 | 6/2006 | Lung |

FOREIGN PATENT DOCUMENTS

KR 20040056027 A 6/2004

OTHER PUBLICATIONS

"Full Integration of Highly Manufacturable 512Mb PRAM based on 90nm Technology", J.H. Oh, et al., IEEE, 2006 (4 pgs.).
"Ultra-Shallow Junction-Formation by Gas Immersion Laser Doping (GILD)", M. Hernandez, et al. (1 pg.).
"Ultra-Shallow Junction-Formation by Gas Immersion Laser Doping (GILD)", M. Hernandez, et al. (1 pg.), Apr. 1, 2004.

* cited by examiner

*Primary Examiner* — Thanh V Pham
*Assistant Examiner* — Mark A Laurenzi
(74) *Attorney, Agent, or Firm* — Dicke, Billig & Czaja, PLLC

(57) ABSTRACT

An integrated circuit includes an array of memory cells and a doped semiconductor line formed in a semiconductor substrate. The doped semiconductor line is coupled to a row of memory cells. The integrated circuit includes conductive cladding contacting the doped semiconductor line.

25 Claims, 20 Drawing Sheets

INTEGRATED CIRCUIT INCLUDING DOPED SEMICONDUCTOR LINE HAVING CONDUCTIVE CLADDING

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of memory array includes heavily doped silicon lines or wires for selecting memory cells for read and write access. The heavily doped silicon lines can carry programming current, read current, or provide a potential mesh, such as a common or ground. The current densities of the lines, however, are limited and the resistivity of the lines is often high leading to undesirable voltage drops across the lines. In memory arrays using diode select devices, the lines increase cross-talk between the memory cells.

For these and other reasons, there is a need for the present invention.

SUMMARY

One embodiment provides an integrated circuit. The integrated circuit includes an array of memory cells and a doped semiconductor line formed in a semiconductor substrate. The doped semiconductor line is coupled to a row of memory cells. The integrated circuit includes conductive cladding contacting the doped semiconductor line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
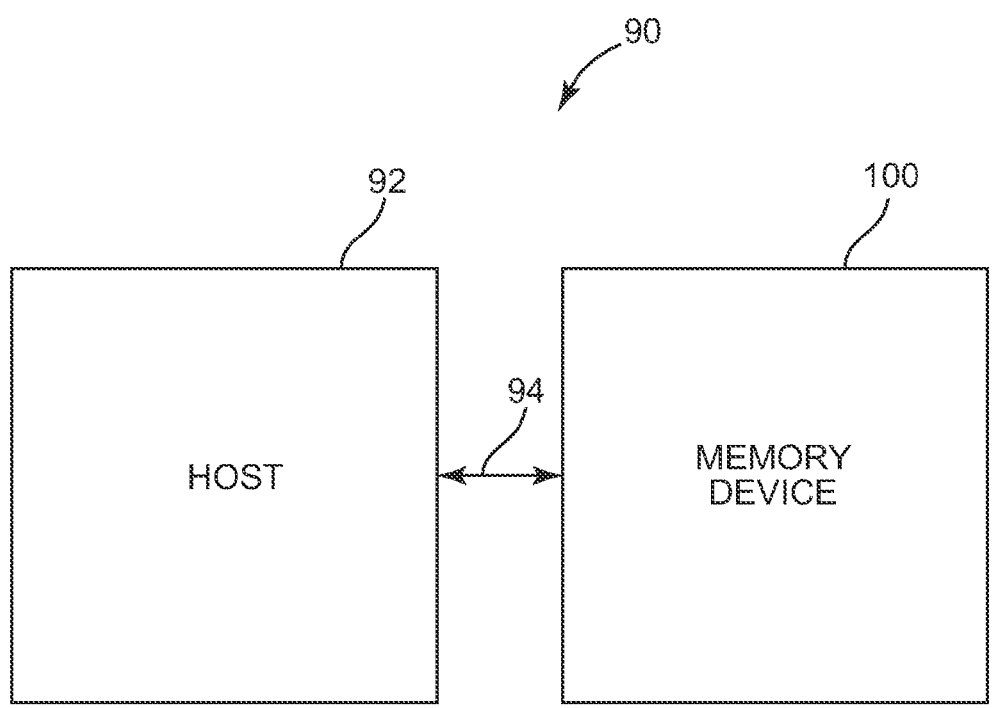
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2A:
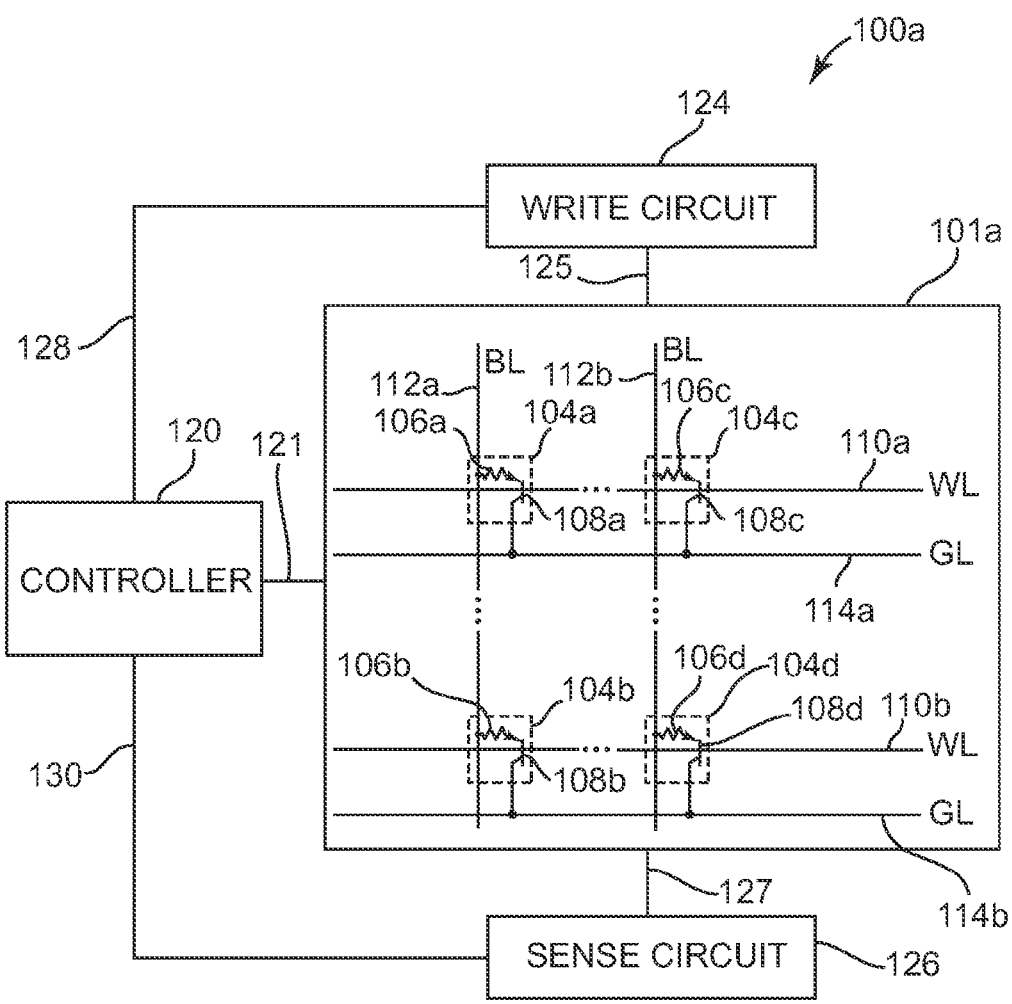
FIG. 2A is a diagram illustrating one embodiment of a memory device.

FIG. 2A is a diagram illustrating one embodiment of a memory device 100a. In one embodiment, memory device 100a is an integrated circuit or part of an integrated circuit. Memory device 100a includes a write circuit 124, a controller 120, a memory array 101a, and a sense circuit 126. Memory array 101a includes a plurality of phase change memory cells 104a-104d (collectively referred to as phase change memory cells 104), a plurality of bit lines (BLs) 112a-112b (collectively referred to as bit lines 112), a plurality of word lines (WLs) 110a-110b (collectively referred to as word lines 110), and a plurality of common or ground lines (GLs) 114a-114b (collectively referred to as ground lines 114). In one embodiment, phase change memory cells 104a-104d are arranged in rows and columns.

In one embodiment, ground lines 114 are formed in a semiconductor substrate by doping the semiconductor substrate and forming isolation regions to provide doped lines of semiconductor material. In one embodiment, the semiconductor substrate is a single crystal silicon substrate and the doped lines are N+ doped silicon lines. The doped lines include a conductive cladding that increases the current density for the lines and reduces the overall resistivity of the lines. The conductive cladding includes C, TiN, a silicide, a gas immersion laser doped (GILD) material, or another suitable material. In addition, the doped lines with conductive cladding reduce the voltage drop across the lines and therefore can be used without area consuming stitching to back end of line (BEOL) metallization levels.

As used herein, the term "electrically coupled" is not meant to mean that the elements must be directly coupled together and intervening elements may be provided between the "electrically coupled" elements.

Memory array 101a is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground line 114. Phase change memory cell 104a is electrically coupled to bit line 112a, word line 110a, and common or ground line 114a, and phase change memory cell 104b is electrically coupled to bit line 112a, word line 110b, and common or ground line 114b. Phase change memory cell 104c is electrically coupled to bit line 112b, word line 110a, and common or ground line 114a, and phase change memory cell 104d is electrically coupled to bit line 112b, word line 110b, and common or ground line 114b.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground line 114a. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground line 114b. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground line 114a. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground line 114b. The gate of transistor 108d is electrically coupled to word line 110b.

In another embodiment, each phase change element 106 is electrically coupled to a common or ground line 114 and each transistor 108 is electrically coupled to a bit line 112. For example, for phase change memory cell 104a, one side of phase change element 106a is electrically coupled to common or ground line 114a. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100a. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "1". In other embodiments, the two or more states can be any suitable number of states in the phase change material of a phase change element.

Controller 120 includes a microprocessor, microcontroller, or other suitable logic circuitry for controlling the operation of memory device 100a. Controller 120 controls read and write operations of memory device 100a including the application of control and data signals to memory array 101a through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101a are set and reset similarly to phase change memory cell 104a using a similar current or voltage pulse.

Figure 2B:
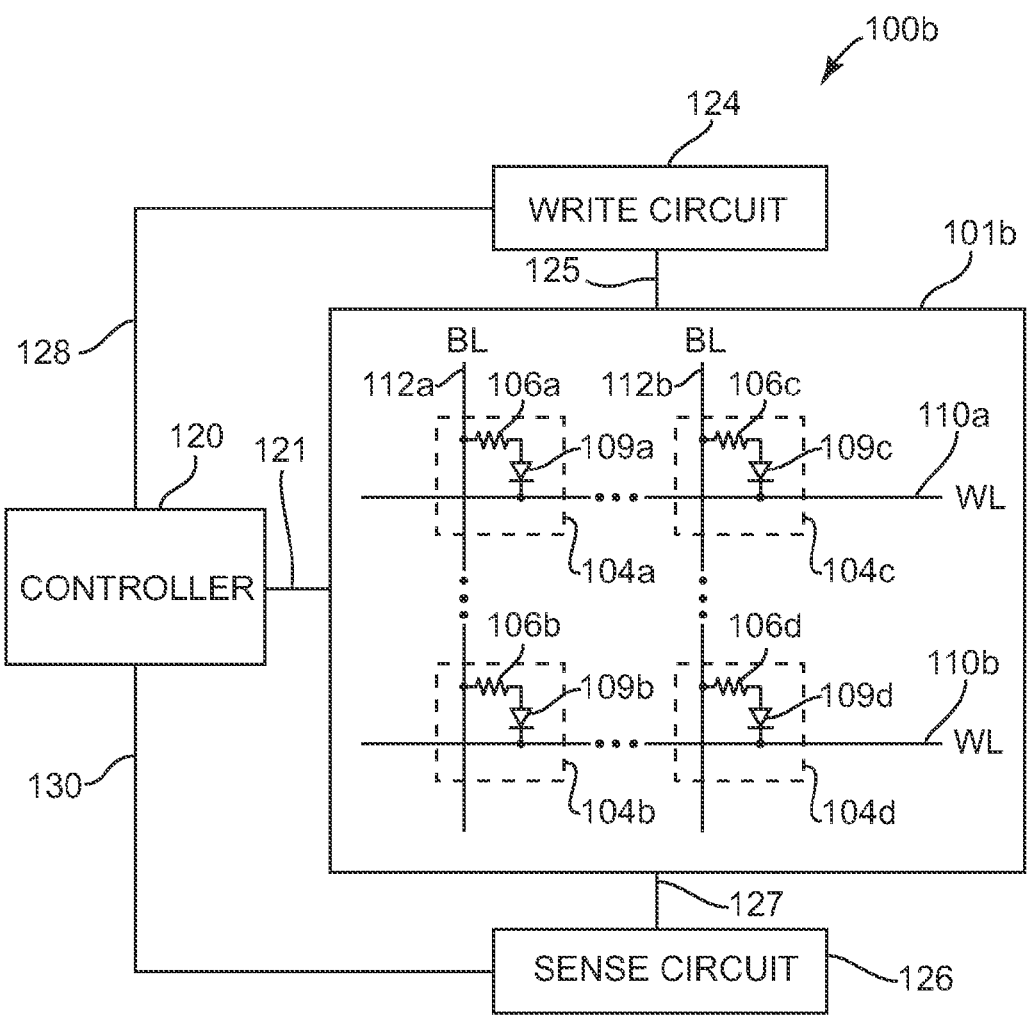
FIG. 2B is a diagram illustrating another embodiment of a memory device.

FIG. 2B is a diagram illustrating another embodiment of a memory device 100b. Memory device 100b is similar to memory device 100a previously described and illustrated with reference to FIG. 2A, except that in memory device 100b memory array 101a is replaced with memory array 101b. Memory array 101b is similar to memory array 101a, except that in memory array 101b transistors 108a-108d are replaced with diodes 109a-109d.

In one embodiment, word lines 110 are formed in a semiconductor substrate by doping the semiconductor substrate and forming isolation regions to provide doped lines of semiconductor material. In one embodiment, the semiconductor substrate is a single crystal silicon substrate and the doped lines are N+ doped silicon lines. The doped lines include a conductive cladding that increases the current density for the lines and reduces the overall resistivity of the lines. The conductive cladding includes C, TiN, a silicide, a gas immersion laser doped (GILD) material, or another suitable material. In addition, the doped lines with conductive cladding reduce the voltage drop across the lines and therefore can be used without area consuming stitching to back end of line (BEOL) metallization levels.

Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 109. In one embodiment, the polarity of diodes 109 is reversed. Phase change memory cell 104a includes phase change element 106a and diode 109a. One side of phase change element 106a is electrically coupled to bit line 112a, and the other side of phase change element 106a is electrically coupled to one side of diode 109a. The other side of diode 109a is electrically coupled to word line 110a.

Phase change memory cell 104b includes phase change element 106b and diode 109b. One side of phase change element 106b is electrically coupled to bit line 112a, and the other side of phase change element 106b is electrically coupled to one side of diode 109b. The other side of diode 109b is electrically coupled to word line 110b.

Phase change memory cell 104c includes phase change element 106c and diode 109c. One side of phase change element 106c is electrically coupled to bit line 112b and the other side of phase change element 106c is electrically coupled to one side of diode 109c. The other side of diode 109c is electrically coupled to word line 110a.

Phase change memory cell 104d includes phase change element 106d and diode 109d. One side of phase change element 106d is electrically coupled to bit line 112b and the other side of phase change element 106d is electrically coupled to one side of diode 109d. The other side of diode 109d is electrically coupled to word line 110b.

In another embodiment, each phase change element 106 is electrically coupled to a word line 110 and each diode 109 is electrically coupled to a bit line 112. For example, for phase change memory cell 104a, one side of phase change element 106a is electrically coupled to word line 110a. The other side of phase change element 106a is electrically coupled to one side of diode 109a. The other side of diode 109a is electrically coupled to bit line 112a. Memory device 100b operates similarly to memory device 100a previously described and illustrated with reference to FIG. 2A.

Embodiments of the present invention relate to new memory technologies based on Si technology, especially to the reduction of the wire resistance of doped Si wires used in the memory array for cell selection. For novel and future memory cell devices, such as phase change random access memory (PCRAM) or magnetic random access memories (MRAM) cell devices, a high performance select array device is used to switch high select currents and/or high select voltages. In this case, it is desirable to reduce the line resistances of the select device to a minimal value. The select device is typically a select diode, a bipolar transistor, or a field effect transistor (FET) like transistor.

Typically, memory arrays use heavily doped Si wires for cell device selection. These wires are used to carry the programming or read current. These wires can also serve as potential mesh (e.g. ground). The current densities, however, are limited and the resistance of these wires is often too high leading to a harmful voltage drop across the line and undesired power losses along the line resistances.

Embodiments of the present invention propose to implement high conductive cladding lines partly around the doped Si to benefit from multiple advantages including:
  The conductive cladding allows significant high current densities that are important to operate novel memory cell concepts at reduced dimensions.
  The conductive cladding results in a low voltage drop across the line, thus resulting also in reduced power consumption and reduced cross talk effects.
  In combination with diode like cross point select devices, a viable realization is possible.
  The conductive cladding leads to a reduction of diode cross talk.
  The proposed concept is applicable for conventional Si wafer substrates and silicon on insulator (SOI) wafers.
  A low resistive connection is obtained without area consuming stitching to BEOL levels.

The manufacturing of the conductive cladding lines can either be chronologically separated from the select device manufacturing process or be included within the select device manufacturing steps. The incorporation of fabrication of the conductive cladding lines can be different for diode based select devices, bipolar transistor select devices, or FET like select devices. Further, as an option the conductive cladding lines can directly contact the memory cell. As a further option, the select device is indirectly coupled to the cladding lines via the memory cell.

Figure 3A:
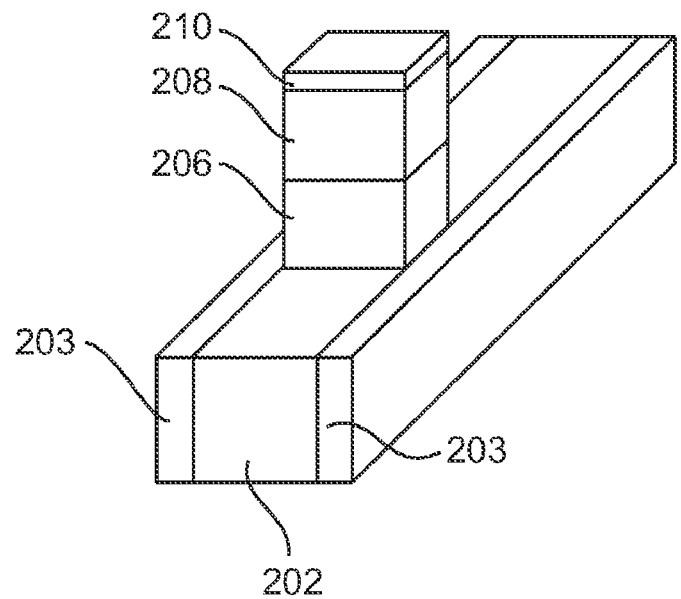
FIG. 3A illustrates a perspective view of one embodiment of a doped semiconductor line including conductive cladding.

FIG. 3A illustrates a perspective view of one embodiment of a doped semiconductor line 202 including conductive cladding 203. In one embodiment, doped semiconductor line 202 is an N+ doped Si line formed from a Si substrate. Conductive cladding 203 laterally surrounds doped semiconductor line 202. Conductive cladding 203 includes C, TiN, a silicide, a GILD material, or another suitable conductive material. In one embodiment, conductive cladding 203 contacts one vertical sidewall of doped semiconductor line 202 and not the other vertical sidewall of doped semiconductor line 202. In one embodiment, a diode including an N− doped Si region 206 and a P+ doped Si region 208 contacts doped semiconductor line 202. A silicide contact 210 contacts P+ doped Si region 208. In one embodiment, silicide contact 210 includes $CoSi_2$, $TiSi_2$, NiSi, or another suitable silicide.

In one embodiment, word lines 110 (FIG. 2B) are similar to doped semiconductor line 202 with conductive cladding 203 and diodes 109 are similar to the diode provided by N− doped Si region 206 and P+ doped Si region 208. In another embodiment, ground lines 114 (FIG. 2A) are similar to doped semiconductor line 202 with conductive cladding 203 and a source or drain region of each transistor 108 contacts a doped semiconductor line 202.

Figure 3B:
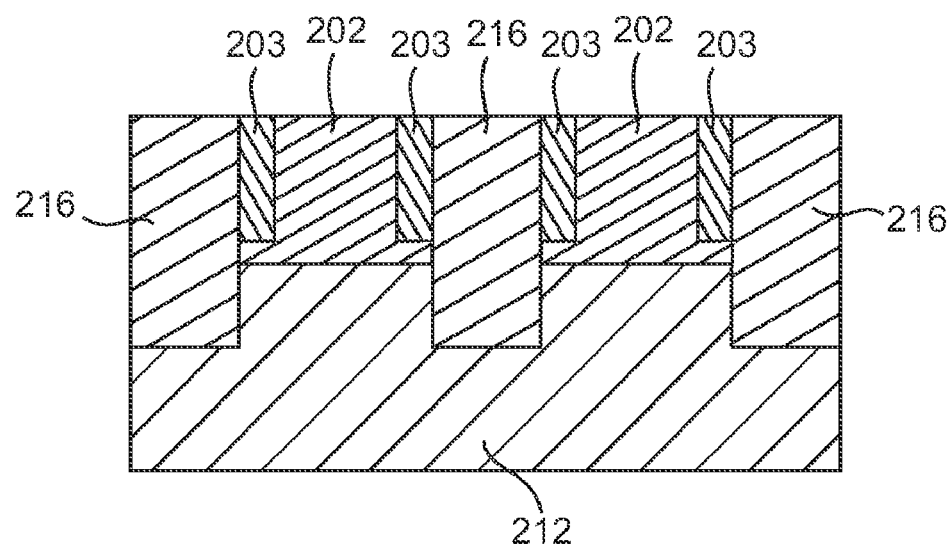
FIG. 3B illustrates a cross-sectional view of one embodiment of doped semiconductor lines including conductive cladding.

FIG. 3B illustrates a cross-sectional view of one embodiment of doped semiconductor lines 202 including conductive cladding 203. Doped semiconductor lines 202 are formed in substrate 212. Isolation regions 216, such as shallow trench isolation (STI) or other suitable isolation, electrically isolates adjacent doped semiconductor lines 202 including conductive cladding 203 from each other. In one embodiment, the bottom and one sidewall of conductive cladding 203 contacts doped semiconductor line 202. In one embodiment, to improve the isolation between adjacent doped semiconductor lines 202 including conductive cladding 203, substrate 212 is properly doped. Both, STI isolation and proper doping is used to suppress leakage currents between neighboring lines 202.

Figure 4:
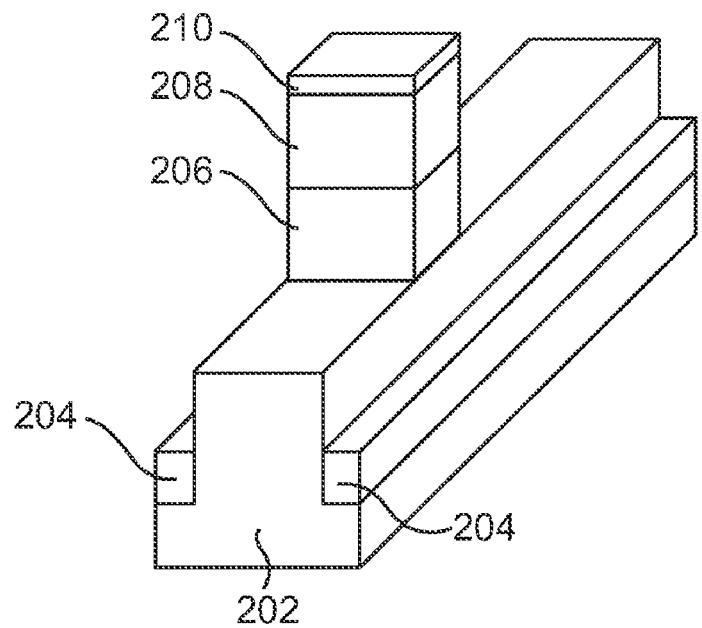
FIG. 4 illustrates a perspective view of another embodiment of a doped semiconductor line including conductive cladding.

FIG. 4 illustrates a perspective view of another embodiment of a doped semiconductor line 202 including conductive cladding 204. This embodiment is similar to the embodiment previously described and illustrated with reference to FIG. 3A, except that in this embodiment conductive cladding 203 is replaced by conductive cladding 204. Conductive cladding 204 laterally encloses a portion of doped semiconductor line 202. In one embodiment, the bottom and one sidewall of conductive cladding 204 contacts doped semiconductor line 202. In one embodiment, conductive cladding 204 contacts one vertical sidewall of doped semiconductor line 202 and not the other vertical sidewall of doped semiconductor line 202.

Figure 5:
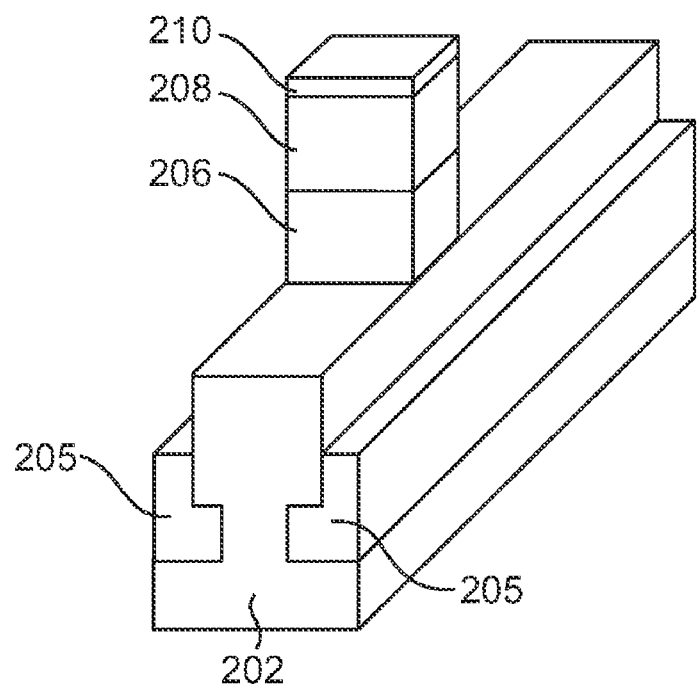
FIG. 5 illustrates a perspective view of another embodiment of a doped semiconductor line including conductive cladding.

FIG. 5 illustrates a perspective view of another embodiment of a doped semiconductor line 202 including conductive cladding 205. This embodiment is similar to the embodiment previously described and illustrated with reference to FIG. 3A, except that in this embodiment conductive cladding 203 is replaced by conductive cladding 205. Conductive cladding 205 contacts a portion of the vertical sidewalls of doped semiconductor line 202 and extends into a central portion of doped semiconductor line 202. The bottom of conductive cladding 205 contacts doped semiconductor line 202. In one embodiment, conductive cladding 205 contacts one vertical sidewall of doped semiconductor line 202 and not the other vertical sidewall of doped semiconductor line 202. It is noted that doped semiconductor lines 202 including conductive cladding 205 are buried in or embraced by a properly doped semiconductor to avoid inter-wiring leakage via the substrate. The doped region can consist of similar doping as silicon wire.

The following FIGS. 6-38 illustrate embodiments for fabricating doped semiconductor lines 202 including conductive cladding, such as conductive cladding 203, 204, or 205. While the illustrated embodiments are focused on using a bulk Si wafer, the embodiments can also be adapted for using silicon on insulator (SOI) wafers or other suitable substrates. The following FIGS. 6-13 illustrate embodiments for fabricating doped semiconductor lines 202 including conductive cladding 203 as previously described and illustrated with reference to FIG. 3A.

Figure 6:
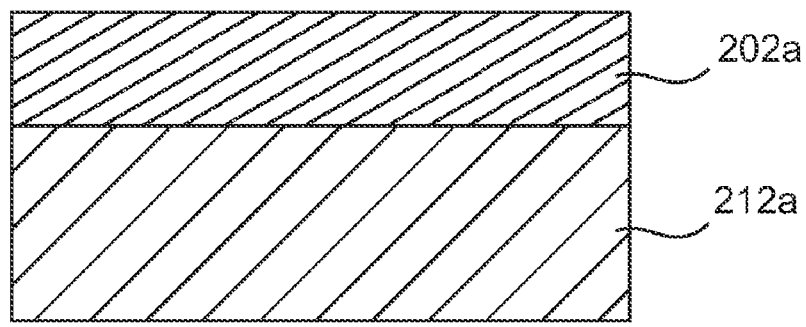
FIG. 6 illustrates a cross-sectional view of one embodiment of a doped semiconductor substrate.

FIG. 6 illustrates a cross-sectional view of one embodiment of a doped semiconductor substrate. A substrate is doped to provide a doped region 202a and an undoped region 212a. In one embodiment, a single crystal Si substrate is doped to provide an N+ doped Si region 202a and an undoped Si region 212a.

Figure 7:
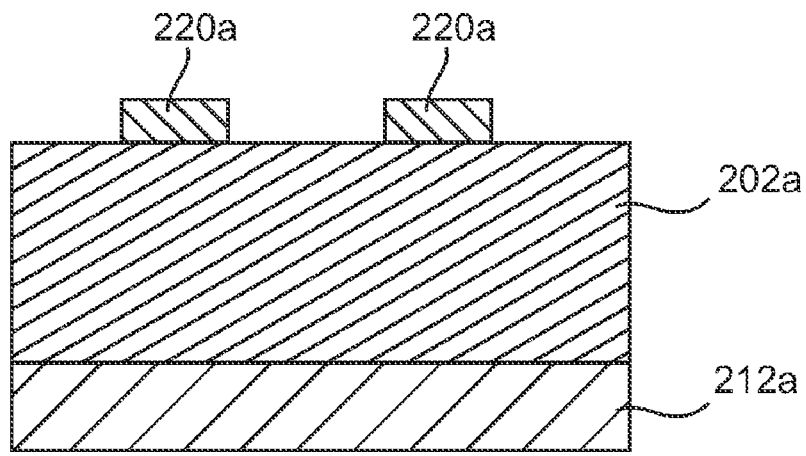
FIG. 7 illustrates a cross-sectional view of one embodiment of the doped semiconductor substrate and a hard mask material layer.

FIG. 7 illustrates a cross-sectional view of one embodiment of the doped semiconductor substrate and a hard mask material layer 220a. A hard mask material, such as SiN or another suitable material is deposited over doped region 202a to provide a hard mask material layer. The hard mask material layer is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVP), or other suitable deposition technique. The hard mask material layer is then patterned using a photolithography process or another suitable process and etched to expose portions of doped region 202a to provide hard mask material layer 220a. In one embodiment, hard mask material layer 220a includes lines of hard mask material.

Figure 8:
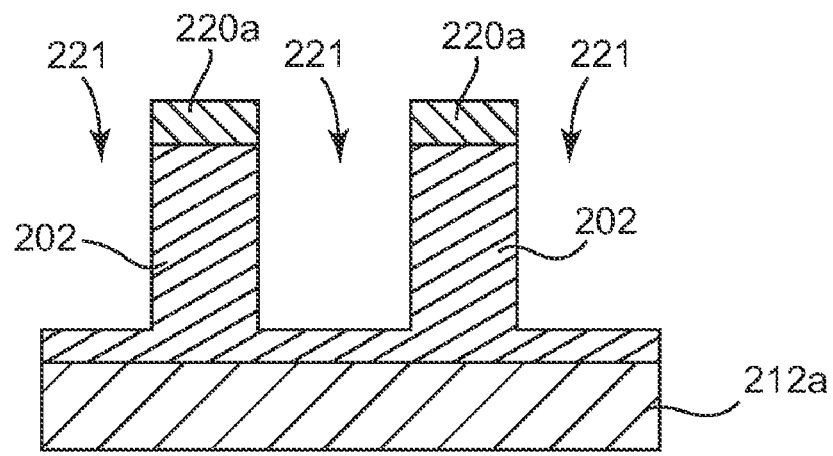
FIG. 8 illustrates a cross-sectional view of one embodiment of the substrate, doped semiconductor lines, and the hard mask material layer after etching the doped semiconductor substrate.

FIG. 8 illustrates a cross-sectional view of one embodiment of substrate 212a, doped semiconductor lines 202, and hard mask material layer 220a after etching doped region 202a. The exposed portions of doped region 202a are etched to provide openings 221. In one embodiment, openings 221 are trenches. In one embodiment, the exposed portions of doped region 202a are etched to provide openings 221 leaving semiconductor materials 202 over substrate 212a. In one embodiment, portions of substrate 212a below openings 221 are also etched. Substrate 212a is then doped to minimize leakage current between doped semiconductor lines 202.

Figure 9:
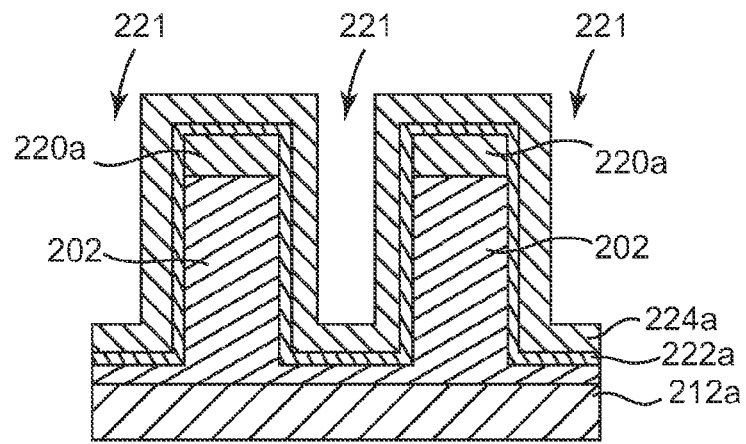
FIG. 9 illustrates a cross-sectional view of one embodiment of the substrate, the doped semiconductor lines, the hard mask material layer, a cladding material layer, and a dielectric material layer.

FIG. 9 illustrates a cross-sectional view of one embodiment of substrate 212a, doped semiconductor lines 202, hard mask material layer 220a, a cladding material layer 222a, and a dielectric material layer 224a. A cladding material, such as C, TiN, or another suitable conductive material is deposited over exposed portions of hard mask material layer 220a, doped semiconductor lines 202, and substrate 212a to provide cladding material layer 222a. Cladding material layer 222a is deposited using CVD, HDP-CVD, ALD, MOCVD, PVD, JVP, or other suitable deposition technique.

A dielectric material, such as $SiO_2$, SiN, non-conducting amorphous carbon, or another suitable dielectric material is deposited over cladding material layer 222a to provide dielectric material layer 224a. Dielectric material layer 224a is deposited using CVD, HDP-CVD, ALD, MOCVD, PVD, JVP, or other suitable deposition technique.

Figure 10A:
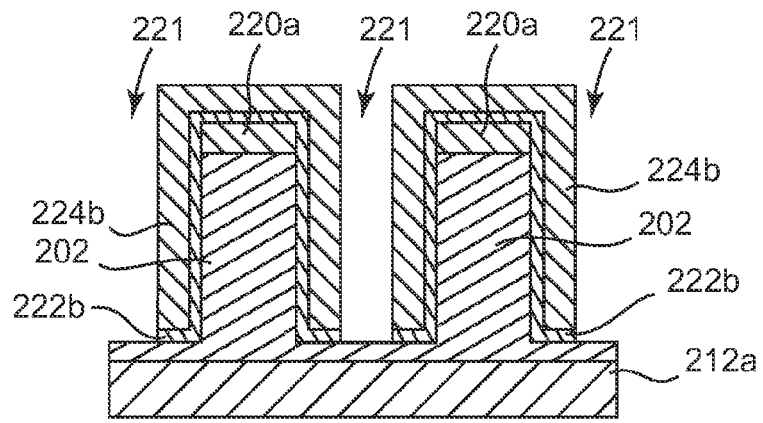
FIG. 10A illustrates a cross-sectional view of one embodiment of the substrate, the doped semiconductor lines, the hard mask material layer, the cladding material layer, and the dielectric material layer after etching the dielectric material layer and the cladding material layer.

FIG. 10A illustrates a cross-sectional view of one embodiment of substrate 212a, doped semiconductor lines 202, hard mask material layer 220a, cladding material layer 222b, and dielectric material layer 224b after etching dielectric material layer 224a and cladding material layer 222a. The portions of dielectric material layer 224a and cladding material layer 222a at the bottom of openings 221 are selectively etched to expose portions of doped semiconductor lines 202 and to provide dielectric material layer 224b and cladding material layer 222b.

Figure 10B:
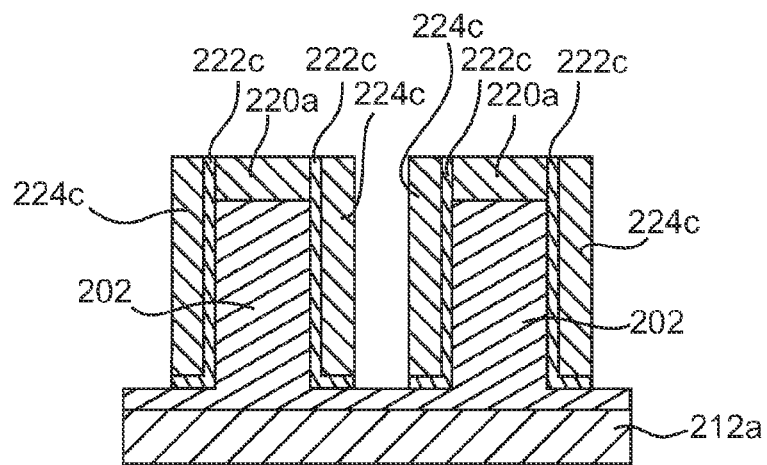
FIG. 10B illustrates a cross-sectional view of another embodiment of the substrate, the doped semiconductor lines, the hard mask material layer, the cladding material layer, and the dielectric material layer after etching the dielectric material layer and the cladding material layer.

FIG. 10B illustrates a cross-sectional view of another embodiment of substrate 212a, doped semiconductor lines 202, hard mask material layer 220a, cladding material layer 222c, and dielectric material layer 224c after etching dielectric material layer 224a and cladding material layer 222a. In this embodiment, dielectric material layer 224a and cladding material layer 222a are spacer etched to expose hard mask material layer 220a and portions of doped semiconductor lines 202 to provide dielectric material layer 224c and cladding material layer 222c. While the following FIGS. 11 and 12 include dielectric material layer 224c and cladding material layer 222c, dielectric material layer 224b and cladding material layer 222b illustrated with reference to FIG. 10A can be used in place of dielectric material layer 224c and cladding material layer 222c.

Figure 11:
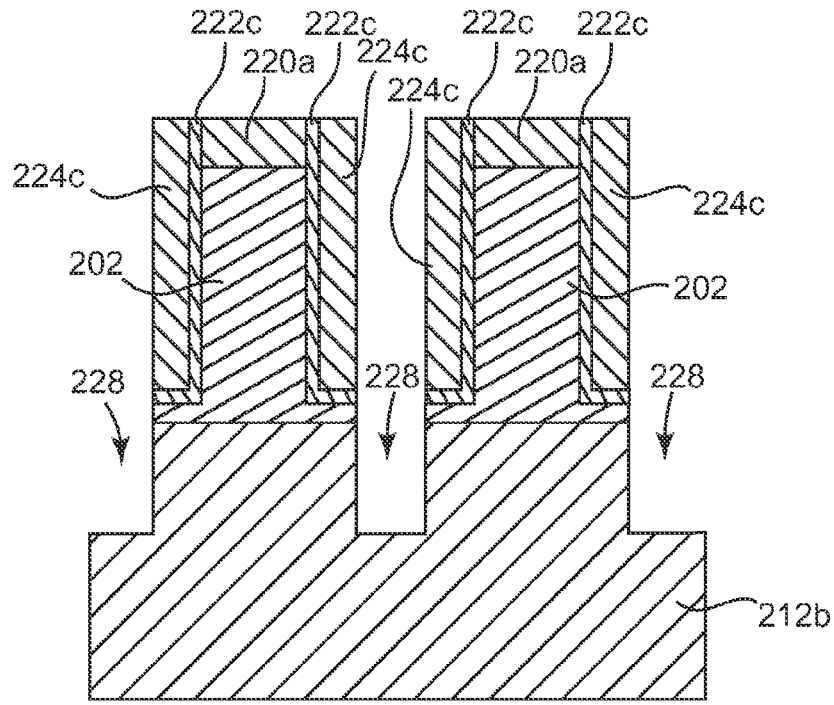
FIG. 11 illustrates a cross-sectional view of one embodiment of the substrate, the doped semiconductor lines, the hard mask material layer, the cladding material layer, and the dielectric material layer after etching portions of the doped semiconductor lines and the substrate.

FIG. 11 illustrates a cross-sectional view of one embodiment of substrate 212b, doped semiconductor lines 202, hard mask material layer 220a, cladding material layer 222c, and dielectric material layer 224c after etching portions of doped semiconductor lines 202 and substrate 212a. The exposed portions of doped semiconductor lines 202 and optionally the underlying portions of substrate 212a are etched to provide openings 228 and substrate 212b.

Figure 12:
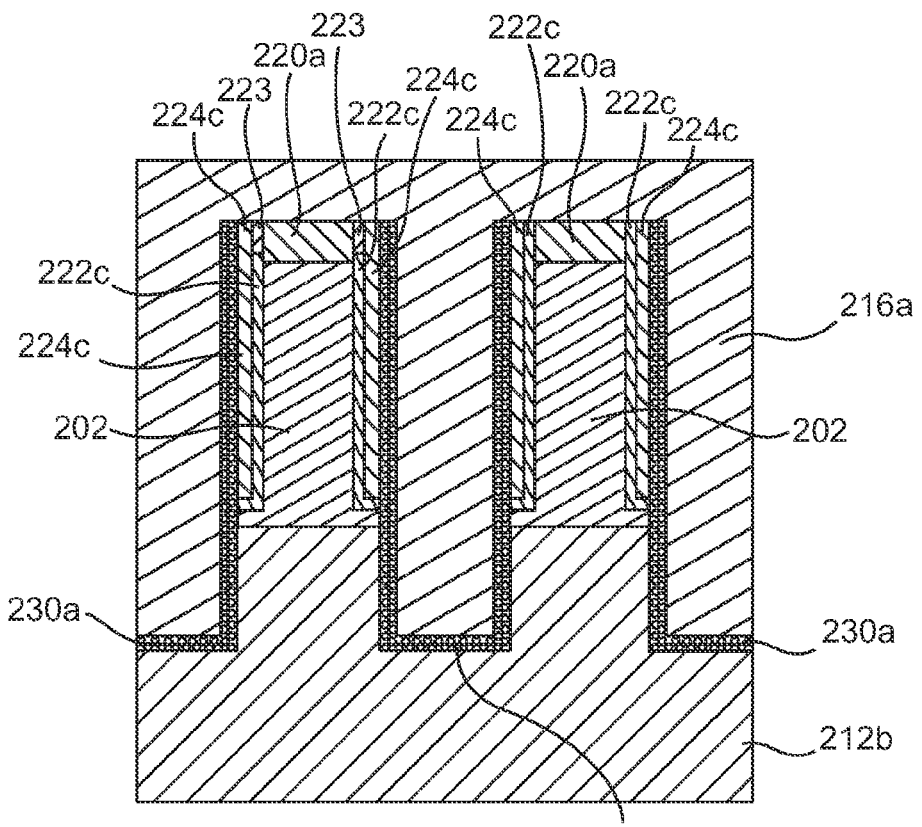
FIG. 12 illustrates a cross-sectional view of one embodiment of the substrate, the doped semiconductor lines, the hard mask material layer, the cladding material layer, the dielectric material layer, shallow trench isolation (STI) passivation material, and STI fill material.

FIG. 12 illustrates a cross-sectional view of one embodiment of substrate 212b, doped semiconductor lines 202, hard mask material layer 220a, cladding material layer 222c, dielectric material layer 224c, STI passivation material 230a, and STI fill material 216a. Exposed portions of dielectric material layer 224c and substrate 212b are subjected to an STI passivation process to oxidize the exposed surfaces of dielectric material layer 224c and substrate 212b to provide STI passivation material 230a. In one embodiment, a portion of cladding material layer 222c as indicated at 223 may also be oxidized during the STI passivation process.

An STI fill material, such as $SiO_2$, fluorinated silica glass (FSG), boron-phosphorous silicate glass (BPSG), boron-silicate glass (BSG), or other suitable dielectric material is deposited over exposed portions of hard mask material layer 220a, cladding material layer 222c, dielectric material layer 224c, and STI passivation material 230a to provide STI fill material 216a. STI fill material 216a is deposited using CVD, HDP-CVD, ALD, MOCVD, PVD, JVP, spin-on, or other suitable deposition technique.

Figure 13:
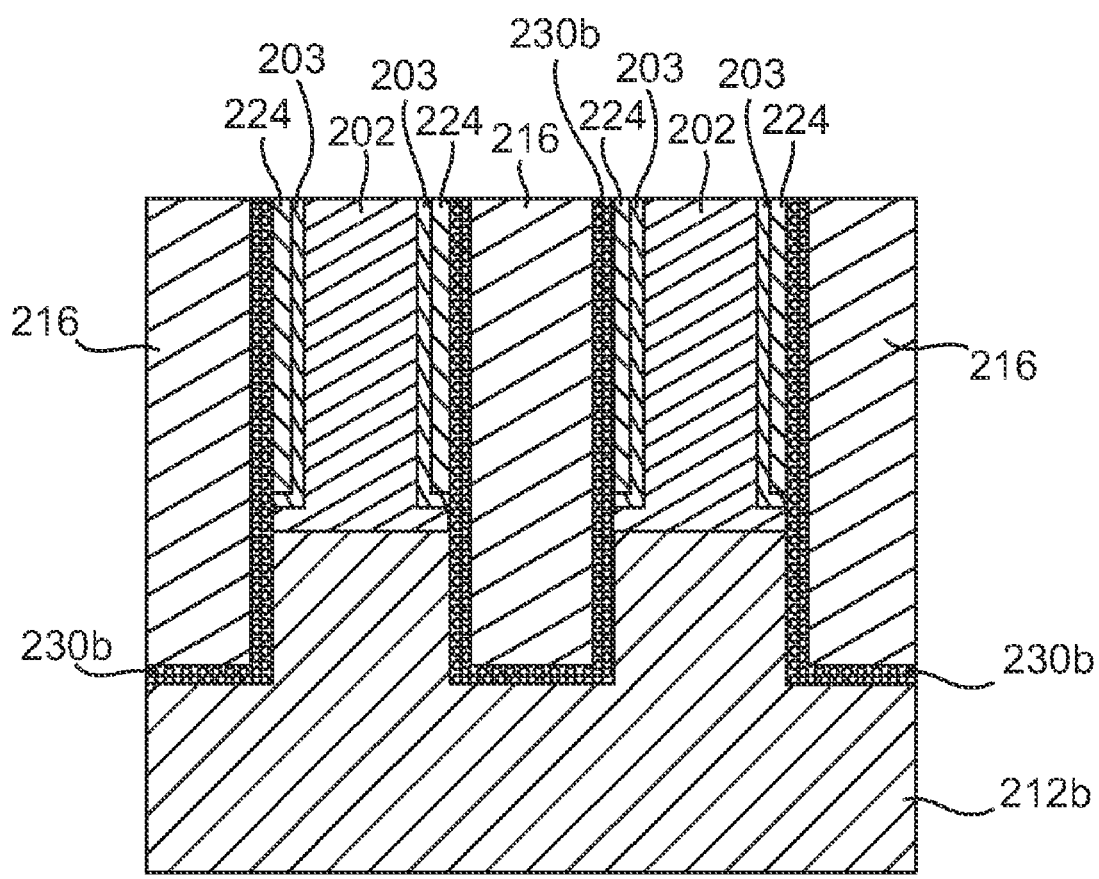
FIG. 13 illustrates a cross-sectional view of one embodiment of the substrate, the doped semiconductor lines, the cladding material layer, the dielectric material layer, the STI passivation material, and the STI fill material after planarization.

FIG. 13 illustrates a cross-sectional view of one embodiment of substrate 212b, doped semiconductor lines 202, conductive cladding 203, dielectric material 224, STI passivation material 230b, and STI fill material 216 after planarization. STI fill material 216a, hard mask material layer 220a, cladding material layer 222c, dielectric material layer 224c, and STI passivation material 230a are planarized to expose doped semiconductor lines 202 to provide conductive cladding 203, dielectric material 224, STI passivation material 230b, and STI fill material 216. STI fill material 216a, hard mask material layer 220a, cladding material layer 222c, dielectric material layer 224c, and STI passivation material 230a are planarized using chemical mechanical planarization (CMP) or another suitable planarization technique to provide doped semiconductor lines 202 including conductive cladding 203 as previously described and illustrated with reference to FIG. 3A.

The following FIGS. 14-19 illustrate embodiments for fabricating doped semiconductor lines 202 including conductive cladding 203 as previously described and illustrated with reference to FIG. 3A. The fabrication process begins as previously described and illustrated with reference to FIGS. 6 and 7.

Figure 14:
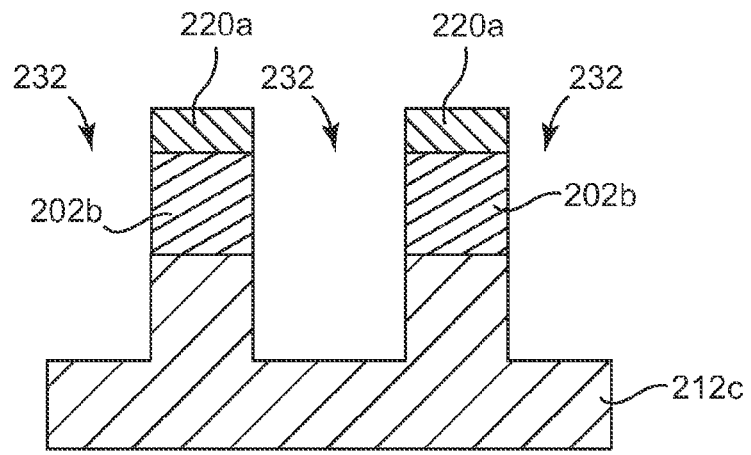
FIG. 14 illustrates a cross-sectional view of one embodiment of the substrate, doped semiconductor lines, and a hard mask material layer after etching the doped semiconductor substrate.

FIG. 14 illustrates a cross-sectional view of one embodiment of substrate 212c, doped semiconductor lines 202b, and hard mask material layer 220a after etching doped region 202a and substrate 212a. The exposed portions of doped region 202a and the underlying portions of substrate 212a are etched to provide openings 232, doped semiconductor lines 202b, and substrate 212c. In one embodiment, openings 232 are trenches.

Figure 15:
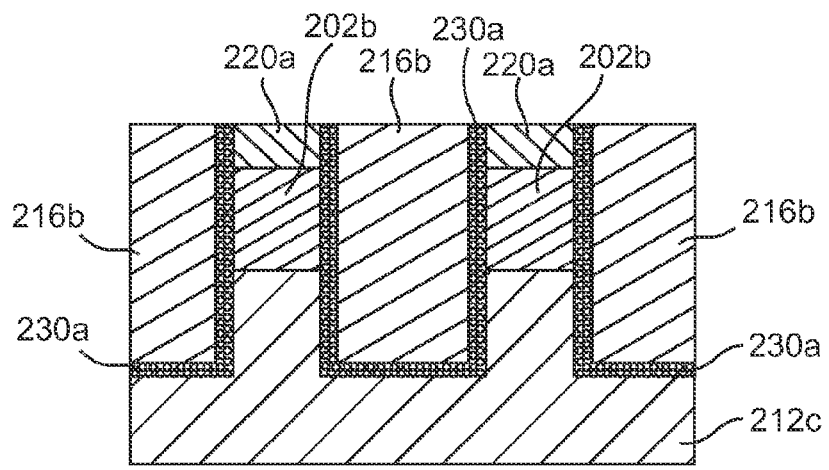
FIG. 15 illustrates a cross-sectional view of one embodiment of the substrate, the doped semiconductor lines, the hard mask material layer, STI passivation material, and STI fill material.

FIG. 15 illustrates a cross-sectional view of one embodiment of substrate 212c, doped semiconductor lines 202b, hard mask material layer 220a, STI passivation material 230a, and STI fill material 216b. Exposed portions of hard mask material layer 220a, doped semiconductor lines 202b, and substrate 212c are subjected to an STI passivation process to oxidize the exposed surfaces of hard mask material layer 220a, doped semiconductor lines 202b, and substrate 212c to provide STI passivation material.

An STI fill material, such as $SiO_2$, FSG, BPSG, BSG, or other suitable dielectric material is deposited over the STI passivation material. The STI fill material is deposited using CVD, HDP-CVD, ALD, MOCVD, PVD, JVP, spin-on, or other suitable deposition technique. The STI fill material and the STI passivation material is then planarized to expose hard mask material layer 220a to provide STI passivation material 230a and STI fill material 216b. The STI fill material and the STI passivation material are planarized using CMP or another suitable planarization technique.

Figure 16:
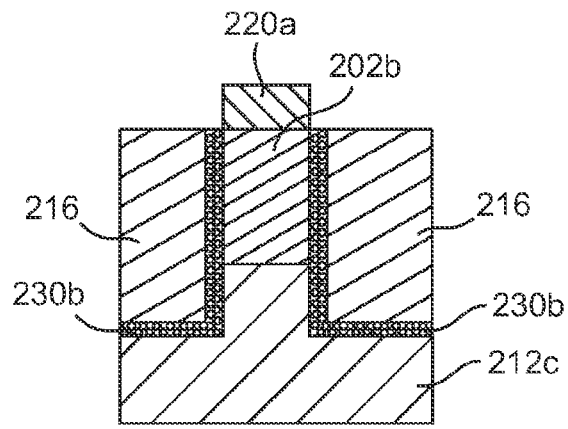
FIG. 16 illustrates a cross-sectional view of one embodiment of the substrate, the doped semiconductor lines, the hard mask material layer, the STI passivation material, and the STI fill material after etching the STI passivation material and the STI fill material.

FIG. 16 illustrates a cross-sectional view of one embodiment of substrate 212c, doped semiconductor lines 202b, hard mask material layer 220a, STI passivation material 230b, and STI fill material 216 after etching STI passivation material 230a and STI fill material 216b. STI passivation material 230a and STI fill material 216b are etched using CMP dishing, an HF dip, a selective etch, or another suitable technique to expose the sidewalls of hard mask material layer 220a to provide STI passivation material 230b and STI fill material 216.

Figure 17:
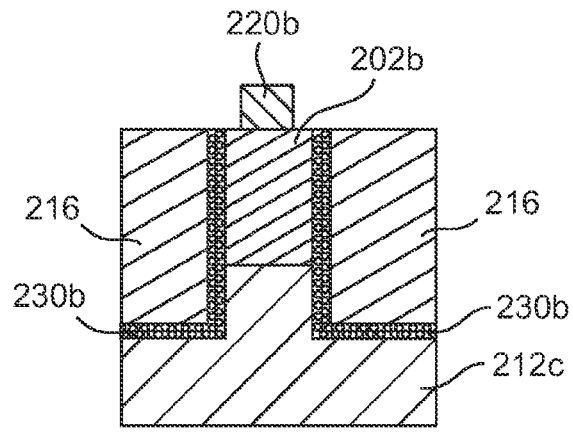
FIG. 17 illustrates a cross-sectional view of one embodiment of the substrate, the doped semiconductor lines, the hard mask material layer, the STI passivation material, and the STI fill material after etching the hard mask material layer.

FIG. 17 illustrates a cross-sectional view of one embodiment of substrate 212c, doped semiconductor lines 202b, hard mask material layer 220b, STI passivation material 230b, and STI fill material 216 after etching hard mask material layer 220a. Hard mask material layer 220a is etched using a recess etch or another suitable technique to expose portions of doped semiconductor lines 202b.

Figure 18:
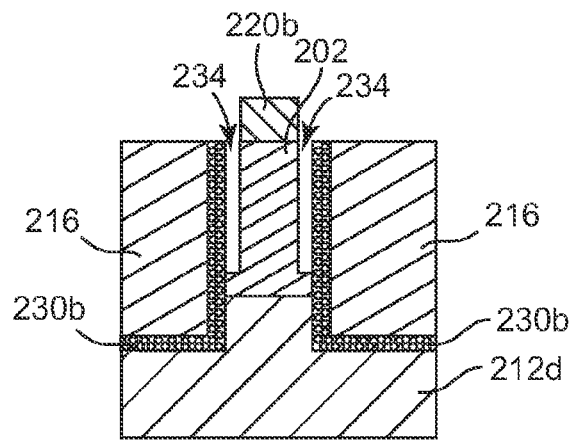
FIG. 18 illustrates a cross-sectional view of one embodiment of the substrate, the doped semiconductor lines, the hard mask material layer, the STI passivation material, and the STI fill material after etching the doped semiconductor lines.

FIG. 18 illustrates a cross-sectional view of one embodiment of substrate 212d, doped semiconductor lines 202, hard mask material layer 220b, STI passivation material 230b, and STI fill material 216 after etching doped semiconductor lines 202b. The exposed portions of doped semiconductor lines 202b and optionally the underlying portions of substrate 212c are selectively etched to a desired depth to provide openings 234, doped semiconductor lines 202, and optionally substrate 212d.

Figure 19:
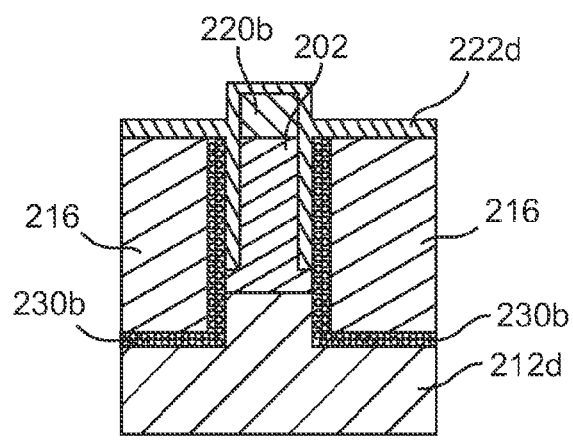
FIG. 19 illustrates a cross-sectional view of one embodiment of the substrate, the doped semiconductor lines, the hard mask material layer, the STI passivation material, the STI fill material, and a cladding material.

FIG. 19 illustrates a cross-sectional view of one embodiment of substrate 212d, doped semiconductor lines 202, hard mask material layer 220b, STI passivation material 230b, STI fill material 216, and a cladding material 222d. A cladding material, such as C, TiN, or another suitable conductive material is deposited over exposed portions of hard mask material layer 220b, doped semiconductor lines 202, STI passivation material 230b, and STI fill material 216 to provide cladding material 222d. Cladding material 222d is deposited using CVD, HDP-CVD, ALD, MOCVD, PVD, JVP, or other suitable deposition technique.

Cladding material 222d and hard mask material layer 220b is then planarized to expose doped semiconductor lines 202 and STI fill material 216 to provide doped semiconductor line 202 including conductive cladding 203 as previously described and illustrated with reference to FIG. 3A. Cladding material 222d and hard mask material layer 220b are planarized using CMP or another suitable planarization technique.

The following FIGS. 20A-24 illustrate embodiments for fabricating doped semiconductor lines 202 including conductive cladding 205 as previously described and illustrated with reference to FIG. 5. The fabrication process begins as previously described and illustrated with reference to FIGS. 6, 7, 14, and 15.

Figure 20A:
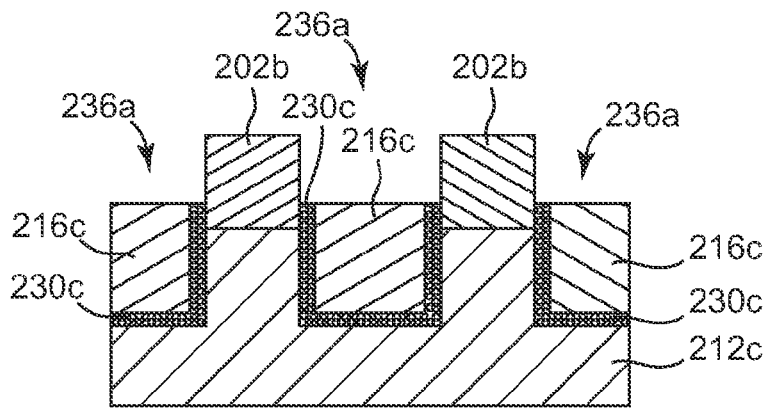
FIG. 20A illustrates a cross-sectional view of one embodiment of the substrate, the doped semiconductor lines, the STI passivation material, and the STI fill material after etching.

FIG. 20A illustrates a cross-sectional view of one embodiment of substrate 212c, doped semiconductor lines 202b, STI passivation material 230c, and STI fill material 216c after etching. STI passivation material 230a and STI fill material 216b are etched to a desired depth to provide openings 236a, STI passivation material 230c, and STI fill material 216c. In one embodiment, openings 236a expose a portion of the sidewalls of doped semiconductor lines 202b. Hard mask material layer 220a is removed to expose the tops of doped semiconductor lines 202b.

Figure 20B:
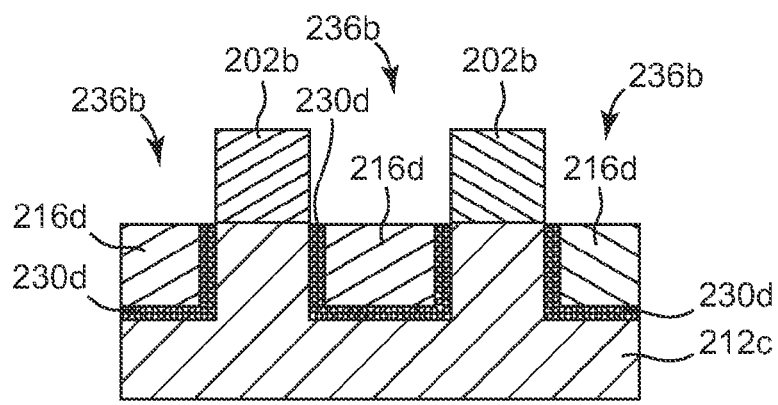
FIG. 20B illustrates a cross-sectional view of another embodiment of the substrate, the doped semiconductor lines, the STI passivation material, and the STI fill material after etching.

FIG. 20B illustrates a cross-sectional view of another embodiment of substrate 212c, doped semiconductor lines 202b, STI passivation material 230d, and STI fill material 216d after etching. STI passivation material 230a and STI fill material 216b are etched to a desired depth to provide openings 236b, STI passivation material 230d, and STI fill material 216d. In one embodiment, openings 236b expose the sidewalls of doped semiconductor lines 202b. Hard mask material layer 220a is removed to expose the tops of doped semiconductor lines 202b.

Figure 20C:
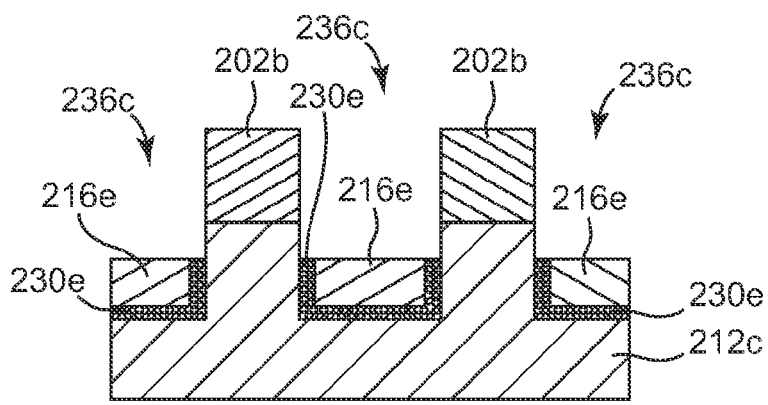
FIG. 20C illustrates a cross-sectional view of another embodiment of the substrate, the doped semiconductor lines, the STI passivation material, and the STI fill material after etching.

FIG. 20C illustrates a cross-sectional view of another embodiment of substrate 212c, doped semiconductor lines 202b, STI passivation material 230e, and STI fill material 216e after etching. STI passivation material 230a and STI fill material 216b are etched to a desired depth to provide openings 236c, STI passivation material 230e, and STI fill material 216e. In one embodiment, openings 236c expose the sidewalls of doped semiconductor lines 202b and portions of the sidewalls of substrate 212c. Hard mask material layer 220a is removed to expose the tops of doped semiconductor lines 202b.

The depth of openings 236a (FIG. 20A), 236b (FIG. 20B), and 236c (FIG. 20C) are selected based on process and performance optimization and/or based on the doping profile of doped semiconductor lines 202. Direct contact of a cladding line with substrate 212c may result in an undesired leakage current between neighboring doped semiconductor lines 202b. Therefore, substrate 212c is properly doped to minimize leakage currents. For example, for a p-doped substrate 212d the cladding lines 222d may be surrounded by n-doped regions.

While the following FIGS. 21 and 22 include STI passivation material 230c and STI fill material 216c as illustrated with reference to FIG. 20A, STI passivation material 230d and STI fill material 216d as illustrated with reference to FIG. 20B or STI passivation material 230e and STI fill material 216e as illustrated with reference to FIG. 20C can be used in place of STI passivation material 230c and STI fill material 216c.

Figure 21:
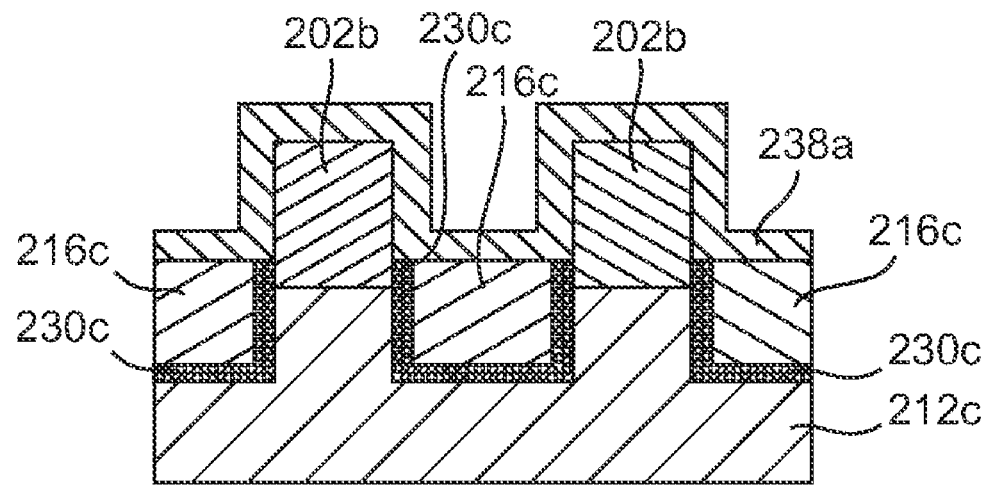
FIG. 21 illustrates a cross-sectional view of one embodiment of the substrate, the doped semiconductor lines, the STI passivation material, the STI fill material, and a spacer material layer.

FIG. 21 illustrates a cross-sectional view of one embodiment of substrate 212c, doped semiconductor lines 202b, STI passivation material 230c, STI fill material 216c, and a spacer material layer 238a. A spacer material, such as SiN or another suitable spacer material is deposited over exposed portions of doped semiconductor lines 202b, STI passivation material 230c, and STI fill material 216c to provide spacer material layer 238a. Spacer material layer 238a is deposited using CVD, HDP-CVD, ALD, MOCVD, PVD, JVP, or other suitable deposition technique.

Figure 22:
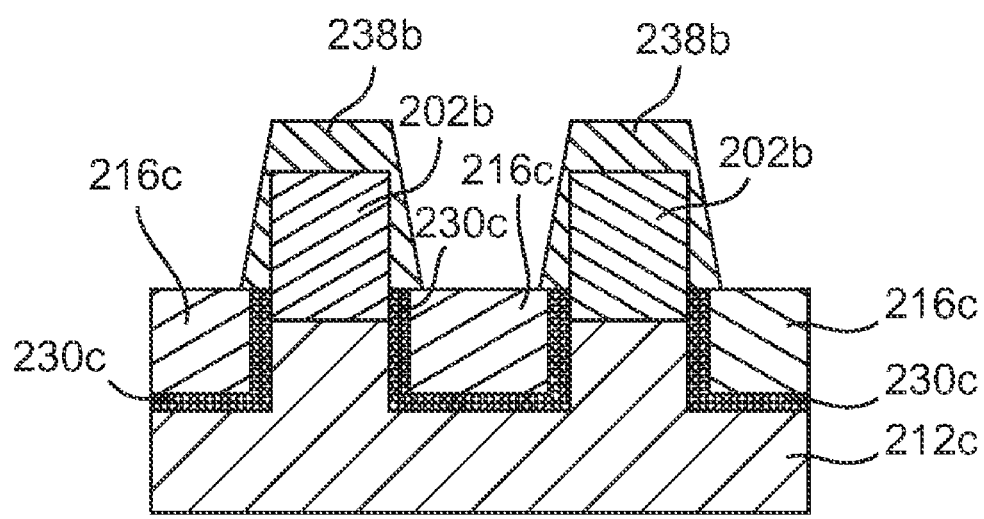
FIG. 22 illustrates a cross-sectional view of one embodiment of the substrate, the doped semiconductor lines, the STI passivation material, the STI fill material, and the spacer material layer after etching the spacer material layer.

FIG. 22 illustrates a cross-sectional view of one embodiment of substrate 212c, doped semiconductor lines 202b, STI passivation material 230c, STI fill material 216c, and spacer material layer 238b after etching spacer material layer 238a. Spacer material layer 238a is etched to expose portions of STI fill material 216c and to provide spacer material layer 238b.

Figure 23:
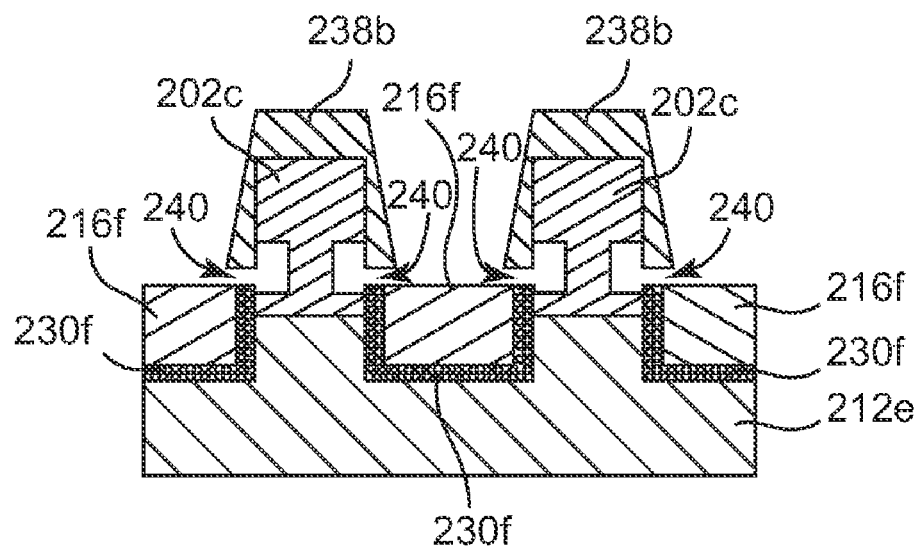
FIG. 23 illustrates a cross-sectional view of one embodiment of the substrate, the doped semiconductor lines, the STI passivation material, the STI fill material, and the spacer material layer after etching the STI passivation material, the STI fill material, the doped semiconductor lines, and the substrate.

FIG. 23 illustrates a cross-sectional view of one embodiment of substrate 212e, doped semiconductor lines 202c, STI passivation material 230f, STI fill material 216f, and spacer material layer 238b after etching STI passivation material 230c, STI fill material 216c, doped semiconductor lines 202b, and optionally substrate 212c. STI passivation material 230c and STI fill material 216c are etched to expose portions of doped semiconductor lines 202b to provide STI passivation material 230f and STI fill material 216f. The exposed portions of doped semiconductor lines 202b and the optionally adjacent portions of substrate 212c are then selectively etched to provide openings 240 and doped semiconductor lines 202c and optionally substrate 212e.

Figure 24:
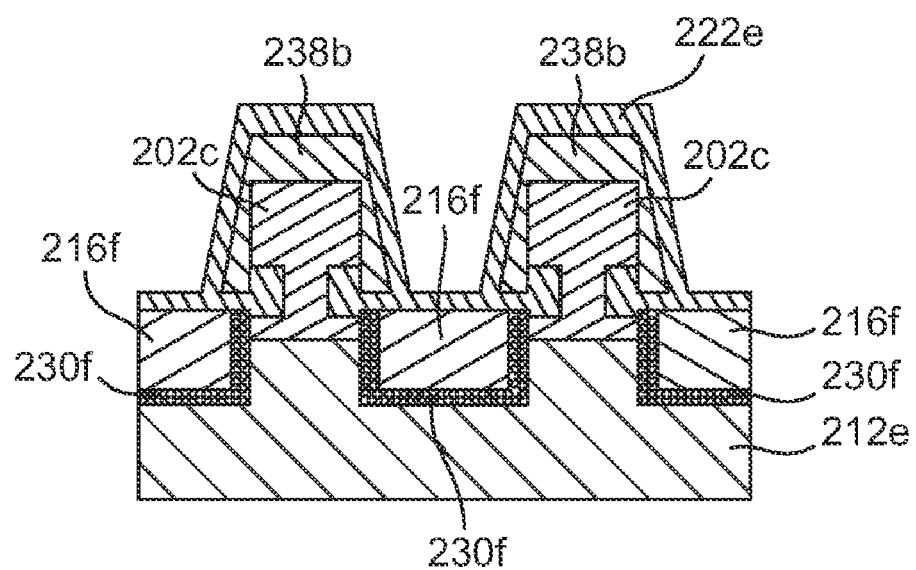
FIG. 24 illustrates a cross-sectional view of one embodiment of the substrate, the doped semiconductor lines, the STI passivation material, the STI fill material, the spacer material layer, and a cladding material.

FIG. 24 illustrates a cross-sectional view of one embodiment of substrate 212e, doped semiconductor lines 202c, STI passivation material 230f, STI fill material 216f, spacer material layer 238b, and a cladding material 222e. A cladding material, such as C, TiN, or another suitable conductive material is deposited over exposed portions of spacer material layer 238b, doped semiconductor lines 202c, STI passivation material 230f, STI fill material 216f, and substrate 212e to provide cladding material 222e. Cladding material 222e is deposited using CVD, HDP-CVD, ALD, MOCVD, PVD, JVP, or other suitable deposition technique.

Cladding material 222e is etched to expose STI fill material 216f. The fabrication process then continues as previously described and illustrated with reference to FIGS. 12 and 13 to provide doped semiconductor lines 202c including conductive cladding similar to doped semiconductor line 202 including conductive cladding 205 previously described and illustrated with reference to FIG. 5.

The following FIGS. 25-31 illustrate embodiments for fabricating doped semiconductor lines 202 including conductive cladding 203 as previously described and illustrated with reference to FIG. 3A. The fabrication process begins as previously described and illustrated with reference to FIGS. 6, 7, and 14.

Figure 25:
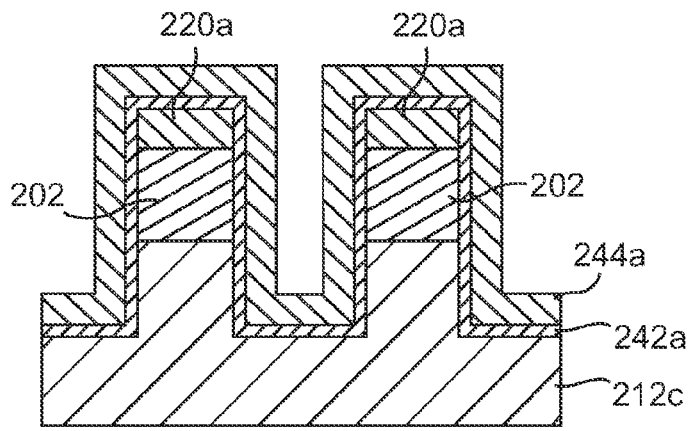
FIG. 25 illustrates a cross-sectional view of one embodiment of the substrate, the doped semiconductor lines, the hard mask material layer, a sacrificial material layer, and a spacer material layer.

FIG. 25 illustrates a cross-sectional view of one embodiment of substrate 212c, doped semiconductor lines 202, hard mask material layer 220a, a sacrificial material layer 242a, and a spacer material layer 244a. A sacrificial material, such as SiO$_2$ or another suitable material is deposited over exposed portions of hard mask material layer 220a, doped semiconductor lines 202, and substrate 212c to provide sacrificial material layer 242a. Sacrificial material layer 242a is deposited using CVD, HDP-CVD, ALD, MOCVD, PVD, JVP, or other suitable deposition technique.

A spacer material, such as SiN or another suitable spacer material is deposited over sacrificial material layer 242a to provide spacer material layer 244a. Spacer material layer 244a is deposited using CVD, HDP-CVD, ALD, MOCVD, PVD, JVP, or other suitable deposition technique.

Figure 26:
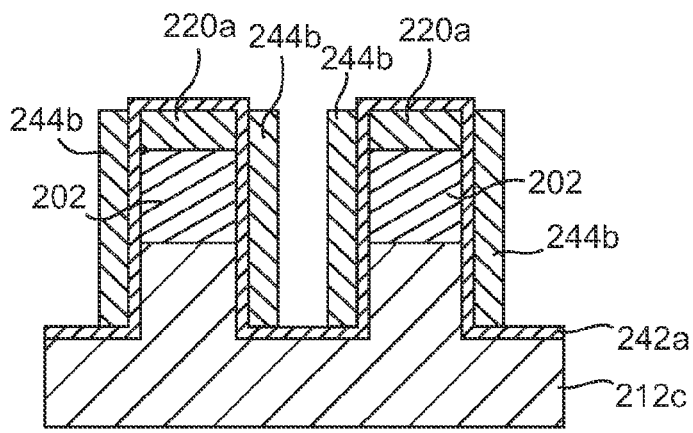
FIG. 26 illustrates a cross-sectional view of one embodiment of the substrate, the doped semiconductor lines, the hard mask material layer, the sacrificial material layer, and spacers after etching the spacer material layer.

FIG. 26 illustrates a cross-sectional view of one embodiment of substrate 212c, doped semiconductor lines 202, hard mask material layer 220a, sacrificial material layer 242a, and spacers 244b after etching spacer material layer 244a. Spacer material layer 244a is spacer etched to expose portions of sacrificial material layer 242a to provide spacers 244b.

Figure 27:
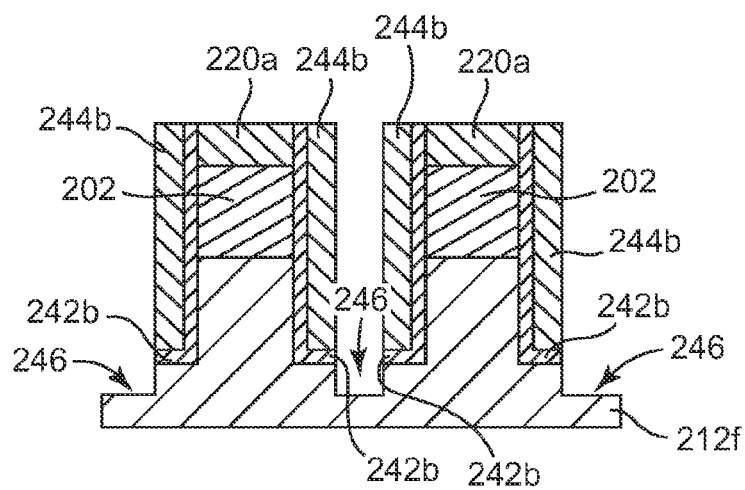
FIG. 27 illustrates a cross-sectional view of one embodiment of the substrate, the doped semiconductor lines, the hard mask material layer, the sacrificial material layer, and the spacers after etching the sacrificial material layer and the substrate.

FIG. 27 illustrates a cross-sectional view of one embodiment of substrate 212f, doped semiconductor lines 202, hard mask material layer 220a, sacrificial material layer 242b, and spacers 244b after etching sacrificial material layer 242a and substrate 212c. The exposed horizontal portions of sacrificial material layer 242a are etched to expose hard mask material layer 220a and substrate 212c to provide sacrificial material layer 242b. The exposed portions of substrate 212c are optionally etched to provide openings 246 and substrate 212f.

Figure 28:
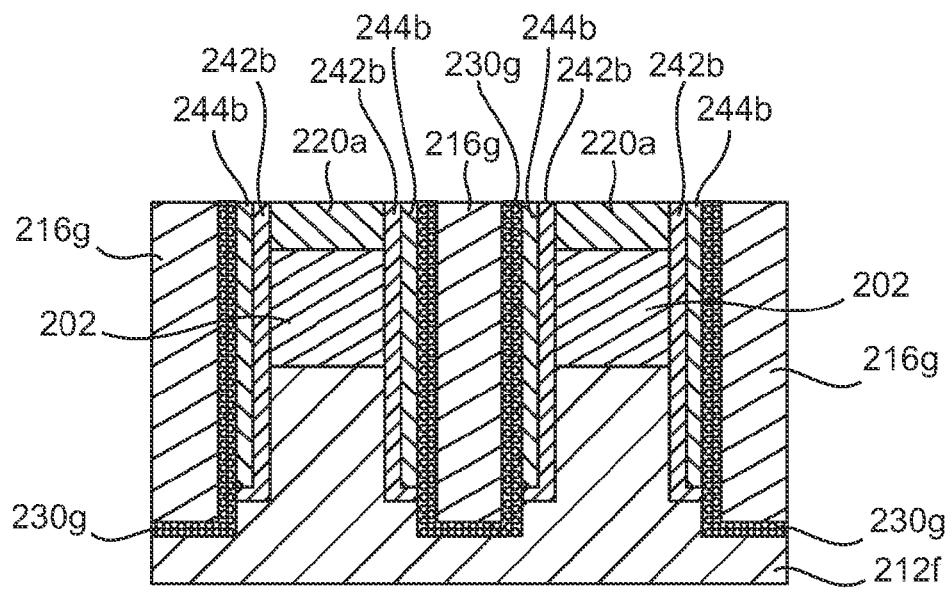
FIG. 28 illustrates a cross-sectional view of one embodiment of the substrate, the doped semiconductor lines, the hard mask material layer, the sacrificial material layer, the spacers, STI passivation material, and STI fill material.

FIG. 28 illustrates a cross-sectional view of one embodiment of substrate 212f, doped semiconductor lines 202, hard mask material layer 220a, sacrificial material layer 242b, spacers 244b, STI passivation material 230g, and STI fill material 216g. Exposed portions of sacrificial material layer 242b, spacers 244b, and substrate 212f are subjected to an STI passivation process to oxidize the exposed surfaces of sacrificial material layer 242b, spacers 244b, and substrate 212f to provide STI passivation material.

An STI fill material, such as SiO$_2$, FSG, BPSG, BSG, or other suitable dielectric material is deposited over the STI passivation material. The STI fill material is deposited using CVD, HDP-CVD, ALD, MOCVD, PVD, JVP, spin-on, or other suitable deposition technique. The STI fill material and the STI passivation material is then planarized to expose hard mask material layer 220a to provide STI passivation material 230g and STI fill material 216g. The STI fill material and the STI passivation material are planarized using CMP or another suitable planarization technique.

Figure 29:
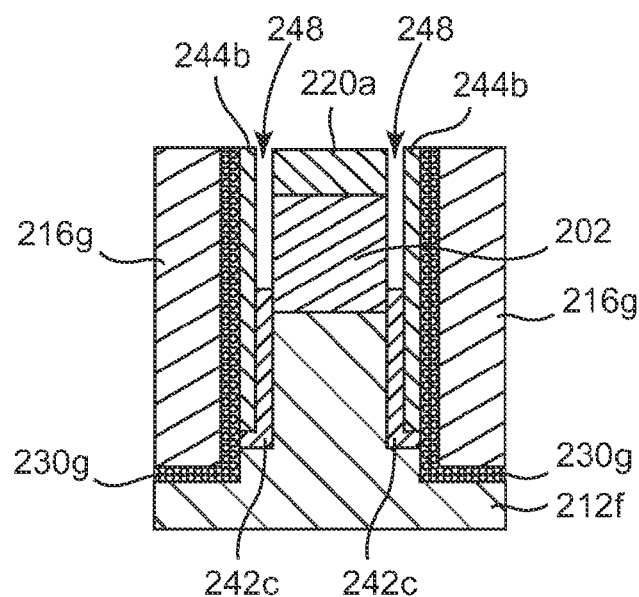
FIG. 29 illustrates a cross-sectional view of one embodiment of the substrate, the doped semiconductor lines, the hard mask material layer, the sacrificial material layer, the spacers, the STI passivation material, and the STI fill material after etching the sacrificial material layer.

FIG. 29 illustrates a cross-sectional view of one embodiment of substrate 212f, doped semiconductor lines 202, hard mask material layer 220a, sacrificial material layer 242c, spacers 244b, STI passivation material 230g, and STI fill material 216g after etching sacrificial material layer 242b. Sacrificial material layer 242b is etched to provide openings 248 having a desired depth and to provide sacrificial material layer 242c.

Figure 30:
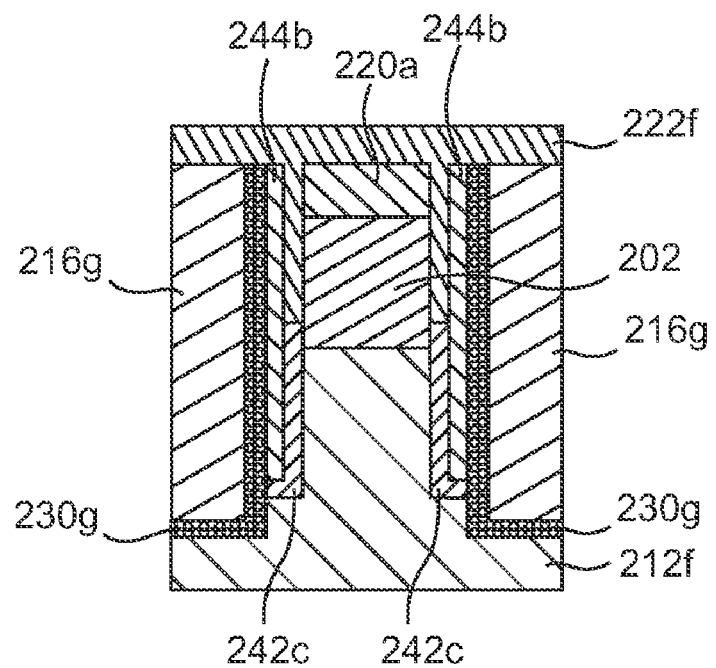
FIG. 30 illustrates a cross-sectional view of one embodiment of the substrate, the doped semiconductor lines, the hard mask material layer, the sacrificial material layer, the spacers, the STI passivation material, the STI fill material, and a cladding material.

FIG. 30 illustrates a cross-sectional view of one embodiment of substrate 212f, doped semiconductor lines 202, hard mask material layer 220a, sacrificial material layer 242c, spacers 244b, STI passivation material 230g, STI fill material 216g, and a cladding material 222f. A cladding material, such as C, TiN, or another suitable conductive material is deposited over exposed portions of hard mask material layer 220a, doped semiconductor lines 202, sacrificial material layer 242c, STI passivation material 230g, STI fill material 216g, and substrate 212f to provide cladding material 222f. Cladding material 222f is deposited using CVD, HDP-CVD, ALD, MOCVD, PVD, JVP, or other suitable deposition technique.

Figure 31:
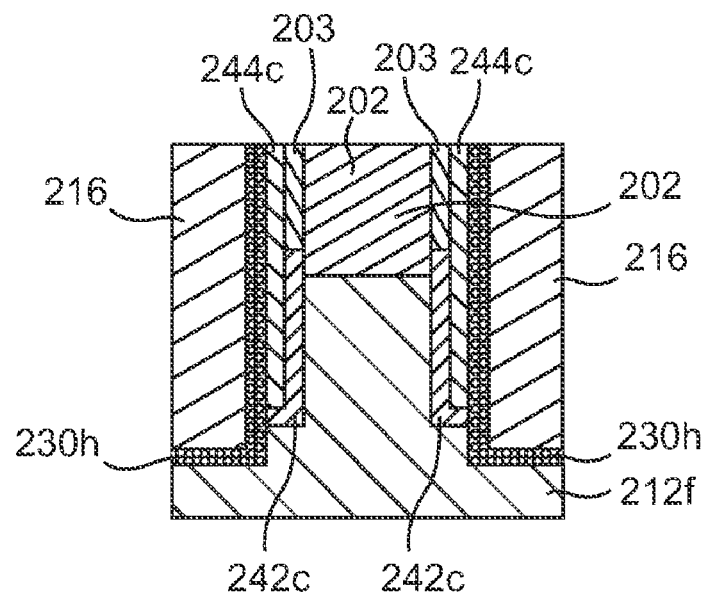
FIG. 31 illustrates a cross-sectional view of one embodiment of the substrate, the doped semiconductor lines, the sacrificial material layer, the spacers, the STI passivation material, the STI fill material, and the conductive cladding after planarization.

FIG. 31 illustrates a cross-sectional view of one embodiment of substrate 212f, doped semiconductor lines 202, sacrificial material layer 242c, spacers 244c, STI passivation material 230h, STI fill material 216, and conductive cladding 203 after planarization. Cladding material 222f, hard mask material layer 220a, spacers 244b, STI passivation material 230g, and STI fill material 216g are planarized to expose doped semiconductor lines 202 to provide conductive cladding 203, spacers 244c, STI passivation material 230h, and STI fill material 216. Cladding material 222f, hard mask material layer 220a, spacers 244b, STI passivation material 230g, and STI fill material 216g are planarized using CMP or another suitable planarization technique to provide doped semiconductor line 202 including conductive cladding 203 as previously described and illustrated with reference to FIG. 3A.

Figure 32:
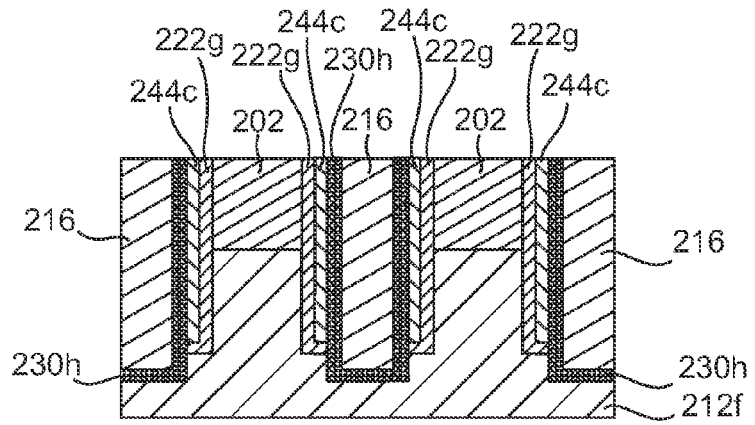
FIG. 32 illustrates a cross-sectional view of another embodiment of the substrate, the doped semiconductor lines, the spacers, the STI passivation material, the STI fill material, and the conductive cladding after planarization.

FIG. 32 illustrates a cross-sectional view of another embodiment of substrate 212f, doped semiconductor lines 202, spacers 244c, STI passivation material 230h, STI fill material 216, and conductive cladding 222g after planarization. This embodiment is similar to the embodiment previously described and illustrated with reference to FIG. 31, except that in this embodiment sacrificial material layer 242b is completely removed and replaced by conductive cladding 222g. Substrate 212f is properly doped to minimize leakage currents between doped semiconductor lines 202.

Figure 33:
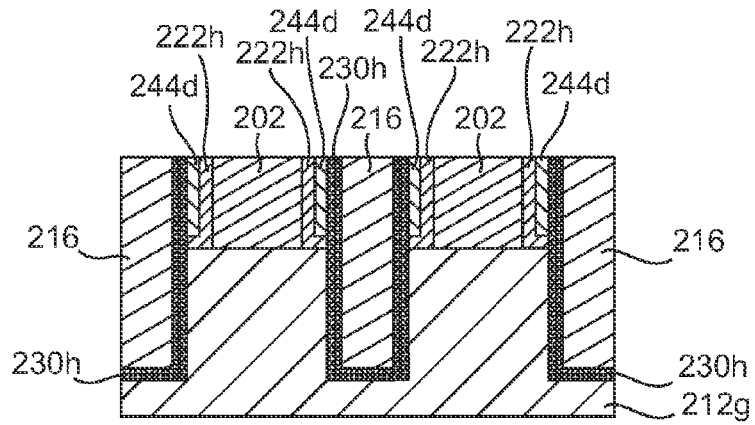
FIG. 33 illustrates a cross-sectional view of another embodiment of the substrate, the doped semiconductor lines, the spacers, the STI passivation material, the STI fill material, and the conductive cladding after planarization.

FIG. 33 illustrates a cross-sectional view of another embodiment of substrate 212g, doped semiconductor lines 202, spacers 244d, STI passivation material 230h, STI fill material 216, and conductive cladding 222h after planarization. This embodiment is similar to the embodiment previously described and illustrated with reference to FIG. 31, except that in this embodiment conductive cladding 222h and spacers 244d both have the same height as doped semiconductor lines 202. In this embodiment, the sacrificial material layer is completely removed and replaced by conductive cladding 222h. Substrate 212g is properly doped to minimize leakage currents between doped semiconductor lines 202.

Figure 34:
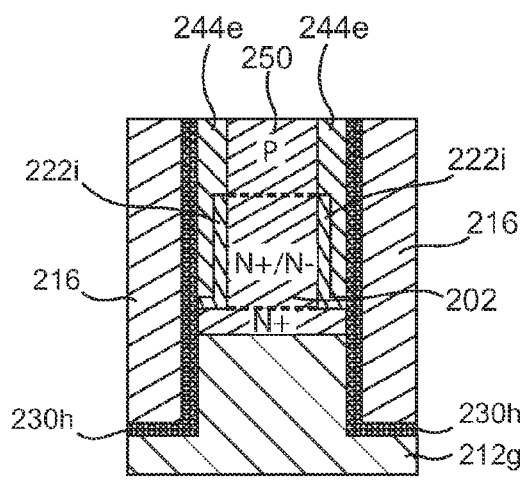
FIG. 34 illustrates a cross-sectional view of another embodiment of the substrate, the doped semiconductor lines, the spacers, the STI passivation material, the STI fill material, and the conductive cladding after planarization.

FIG. 34 illustrates a cross-sectional view of another embodiment of substrate 212g, doped semiconductor lines 202, spacers 244e, STI passivation material 230h, STI fill material 216, and conductive cladding 222i after planarization. This embodiment is similar to the embodiment previously described and illustrated with reference to FIG. 33, except that this embodiment includes an additional doped region 250. In one embodiment, doped semiconductor line 202 includes an N+ doped lower region and an N− doped upper region. The N− doped upper region contacts a P doped region 250. Doped semiconductor line 202 and P doped region 250 are both etched from the substrate. P doped region 250 is then etched to provide individual diodes contacting doped semiconductor line 202 including conductive cladding 222i.

The following FIGS. 35-38 illustrate embodiments for fabricating doped semiconductor lines 202 including conductive cladding 203 as previously described and illustrated with reference to FIG. 3A. The fabrication process begins as previously described and illustrated with reference to FIGS. 6-8.

Figure 35:
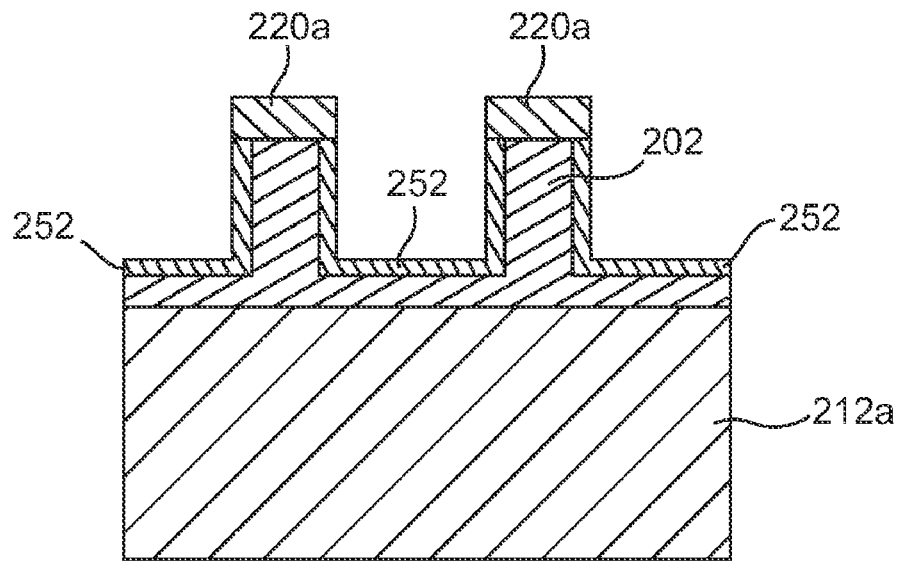
FIG. 35 illustrates a cross-sectional view of one embodiment of the substrate, the doped semiconductor lines, the hard mask material layer, and a gas immersion laser doped material layer.

FIG. 35 illustrates a cross-sectional view of one embodiment of substrate 212a, doped semiconductor lines 202, hard mask material layer 220a, and a gas immersion laser doped (GILD) material layer 252. The exposed portions of doped semiconductor lines 202 and optionally substrate 212a are subjected to a gas immersion laser doping process. In one embodiment, $BCl_3$ is used as the dopant in the GILD process to provide GILD material layer 252.

Figure 36:
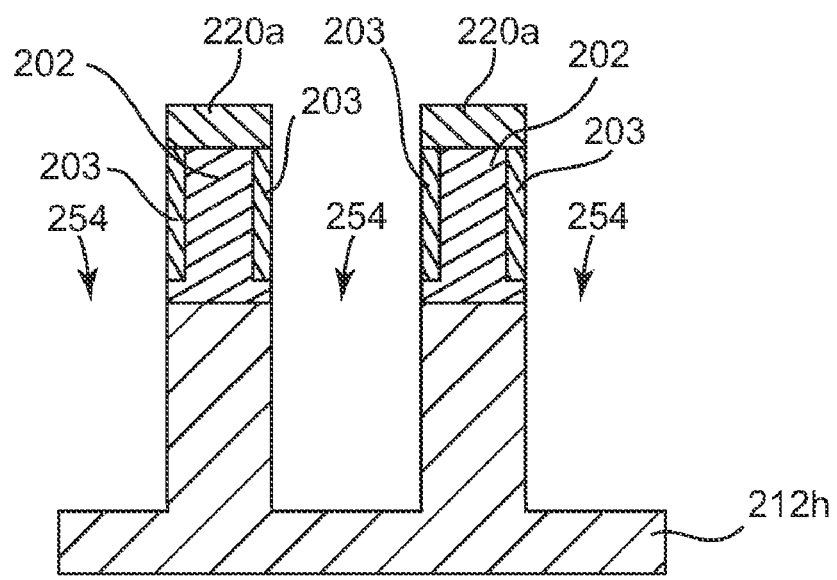
FIG. 36 illustrates a cross-sectional view of one embodiment of the substrate, the doped semiconductor lines, the hard mask material layer, and conductive cladding after etching the gas immersion laser doped material layer and the substrate.

FIG. 36 illustrates a cross-sectional view of one embodiment of substrate 212h, doped semiconductor lines 202, hard mask material layer 220a, and conductive cladding 203 after etching GILD material layer 252 and substrate 212a. The horizontal portions of GILD material layer 252 are etched to expose portions of doped semiconductor lines 202 and to provide conductive cladding 203. The exposed portions of doped semiconductor lines 202 and the underlying portions of substrate 212a are then etched to provide openings 254 and to provide substrate 212h.

Figure 37:
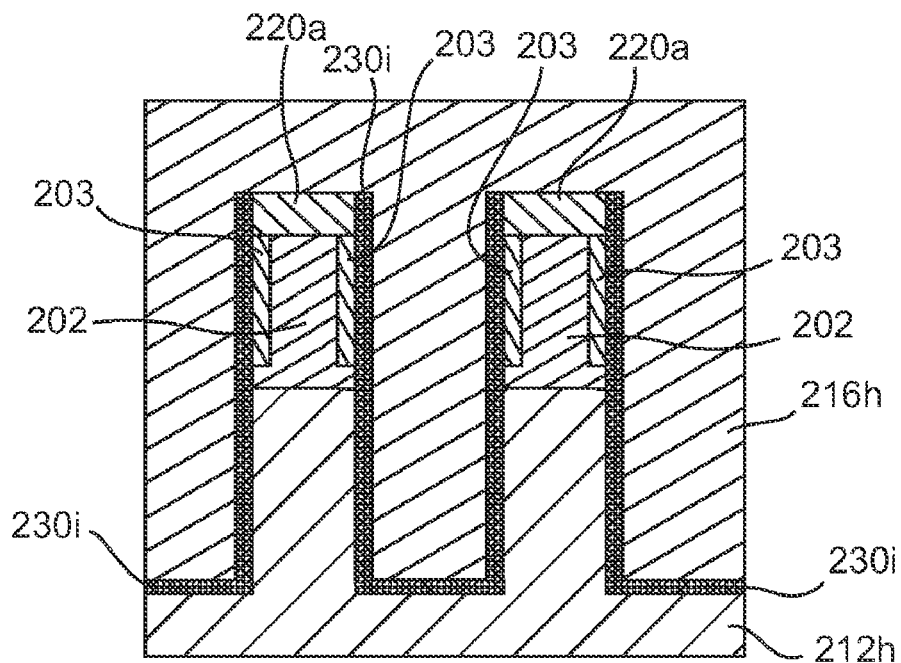
FIG. 37 illustrates a cross-sectional view of one embodiment of the substrate, the doped semiconductor lines, the hard mask material layer, the conductive cladding, STI passivation material, and STI fill material.

FIG. 37 illustrates a cross-sectional view of one embodiment of substrate 212h, doped semiconductor lines 202, hard mask material layer 220a, conductive cladding 203, STI passivation material 230i, and STI fill material 216h. Exposed portions of hard mask material layer 220a, conductive cladding 203, and substrate 212h are subjected to an STI passivation process to oxidize the exposed surfaces of hard mask material layer 220a, conductive cladding 203, and substrate 212h to provide STI passivation material 230i.

An STI fill material, such as $SiO_2$, FSG, BPSG, BSG, or other suitable dielectric material is deposited over exposed portions of hard mask material layer 220a and STI passivation material 230i to provide STI fill material 216h. STI fill material 216h is deposited using CVD, HDP-CVD, ALD, MOCVD, PVD, JVP, spin-on, or other suitable deposition technique. In another embodiment, the STI regions are formed before the gas immersion laser doping process is performed.

Figure 38:
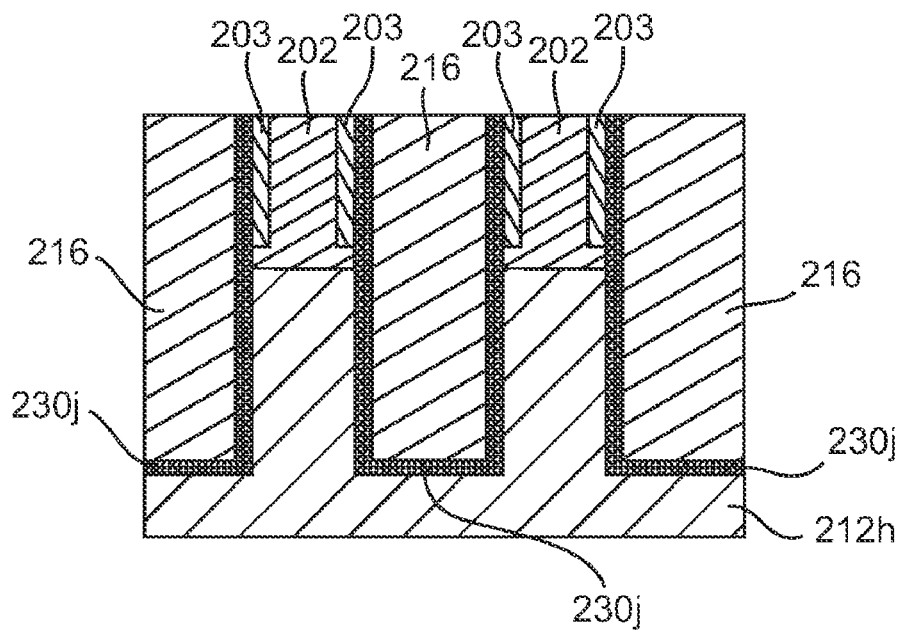
FIG. 38 illustrates a cross-sectional view of one embodiment of the substrate, the doped semiconductor lines, the conductive cladding, the STI passivation material, and the STI fill material after planarization.

FIG. 38 illustrates a cross-sectional view of one embodiment of substrate 212h, doped semiconductor lines 202, conductive cladding 203, STI passivation material 230j, and STI fill material 216 after planarization. STI fill material 216h, hard mask material layer 220a, and STI passivation material 230i are planarized to expose doped semiconductor lines 202 to provide STI passivation material 230j and STI fill material 216. STI fill material 216h, hard mask material layer 220a, and STI passivation material 230i are planarized using CMP or another suitable planarization technique to provide doped semiconductor lines 202 including conductive cladding 203 as previously described and illustrated with reference to FIG. 3A.

In another embodiment, the GILD process followed by a dielectric material fill can be used in place of the deposition of cladding material 222d previously described and illustrated with reference to FIG. 19. In another embodiment, the GILD process followed by a dielectric material fill can be used in place of the deposition of cladding material 222f previously described and illustrated with reference to FIG. 30.

Embodiments provide doped semiconductor lines including conductive cladding. The lines can be used as memory cell select lines within an array of memory cells. The lines increase the current densities that can be achieved compared to unclad lines and reduce cross-talk between diode select devices in a memory array. In addition, the lines have a low resistivity such that the lines can be used without area consuming stitching to back end of line (BEOL) metallization levels.

While the specific embodiments described herein substantially focused on using phase change memory elements, the present invention is applicable to any suitable type of resistive or resistivity changing memory elements. In addition, the embodiments are applicable to any suitable integrated circuit in which conductive lines contacting active devices, such as diodes or transistors, are used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a semiconductor substrate;
    an array of memory cells;
    a doped semiconductor line formed in the semiconductor substrate, the doped semiconductor line coupled to a row of memory cells and directly contacting the semiconductor substrate; and
    conductive cladding directly contacting the doped semiconductor line.

2. The integrated circuit of claim 1, wherein the doped semiconductor line comprises doped Si.

3. The integrated circuit of claim 1, wherein the conductive cladding contacts a first sidewall of the doped semiconductor line.

4. The integrated circuit of claim 3, wherein the conductive cladding contacts an entire length of the doped semiconductor line.

5. The integrated circuit of claim 3, wherein the conductive cladding contacts a second sidewall of the doped semiconductor line.

6. The integrated circuit of claim 5, wherein the conductive cladding contacts a first portion of a bottom of the doped semiconductor line and a second portion of the bottom of the doped semiconductor line.

7. The integrated circuit of claim 1, wherein the conductive cladding comprises one of C, TiN, a silicide, and a gas immersion laser doped material.

8. An integrated circuit comprising:
a doped Si line;
conductive cladding directly contacting a first sidewall and a second sidewall of the doped Si line;
a semiconductor substrate directly contacting a bottom of the doped Si line; and
an active device contacting the doped Si line.

9. The integrated circuit of claim 8, wherein the active device comprises a diode.

10. The integrated circuit of claim 8, wherein the active device comprises a transistor including a source or drain region contacting the doped Si line.

11. The integrated circuit of claim 8, further comprising:
a resistivity changing material coupled to the active device.

12. The integrated circuit of claim 11, wherein the resistivity changing material comprises one of phase change material and magnetic material.

13. An integrated circuit comprising:
a semiconductor substrate;
an array of memory cells;
a doped semiconductor line formed in the semiconductor substrate, the doped semiconductor line coupled to a row of memory cells, and a bottom of the doped semiconductor line directly contacting the semiconductor substrate;
first conductive cladding directly contacting a first sidewall of the doped semiconductor line; and
second conductive cladding directly contacting a second sidewall of the doped semiconductor line opposite the first sidewall, the second conductive cladding not directly contacting the first conductive cladding.

14. The integrated circuit of claim 13, wherein the first conductive cladding contacts only a portion of the first sidewall, and
wherein the second conductive cladding contacts only a portion of the second sidewall.

15. The integrated circuit of claim 13, wherein the doped semiconductor line comprises a third sidewall perpendicular to the first sidewall and a fourth sidewall parallel to the first sidewall, the third sidewall intersecting the first sidewall, and the fourth sidewall intersecting the third sidewall, and
wherein the first conductive cladding contacts the third sidewall.

16. The integrated circuit of claim 15, wherein a sidewall of the first conductive cladding is aligned with the fourth sidewall of the doped semiconductor line.

17. The integrated circuit of claim 15, wherein the doped semiconductor line comprises a fifth sidewall perpendicular to the fourth sidewall and a sixth sidewall parallel to the fourth sidewall, the fifth sidewall intersecting the fourth sidewall, and the sixth sidewall intersecting the fifth sidewall, and
wherein the first conductive cladding contacts the fourth sidewall and the fifth sidewall.

18. The integrated circuit of claim 17, wherein a sidewall of the first conductive cladding is aligned with the sixth sidewall of the doped semiconductor line.

19. The integrated circuit of claim 13, wherein the first conductive cladding comprises one of C, TiN, a silicide, and a gas immersion laser doped material, and
wherein the second conductive cladding comprises one of C, TiN, a silicide, and a gas immersion laser doped material.

20. An integrated circuit comprising:
a doped Si line;
first conductive cladding directly contacting a first sidewall of the doped Si line;
second conductive cladding directly contacting a second sidewall of the doped Si line, the second conductive cladding not directly contacting the first conductive cladding;
a semiconductor substrate directly contacting a bottom of the doped Si line; and
a diode or transistor directly contacting the doped Si line.

21. The integrated circuit of claim 20, wherein the first conductive cladding contacts only a portion of the first sidewall, and
wherein the second conductive cladding contacts only a portion of the second sidewall.

22. The integrated circuit of claim 20, wherein the doped Si line comprises a third sidewall perpendicular to the first sidewall and a fourth sidewall parallel to the first sidewall, the third sidewall intersecting the first sidewall, and the fourth sidewall intersecting the third sidewall, and
wherein the first conductive cladding contacts the third sidewall.

23. The integrated circuit of claim 22, wherein a sidewall of the first conductive cladding is aligned with the fourth sidewall of the doped Si line.

24. The integrated circuit of claim 22, wherein the doped Si line comprises a fifth sidewall perpendicular to the fourth sidewall and a sixth sidewall parallel to the fourth sidewall, the fifth sidewall intersecting the fourth sidewall, and the sixth sidewall intersecting the fifth sidewall, and
wherein the first conductive cladding contacts the fourth sidewall and the fifth sidewall.

25. The integrated circuit of claim 24, wherein a sidewall of the first conductive cladding is aligned with the sixth sidewall of the doped Si line.

* * * * *